(12) United States Patent
Alameh et al.

(10) Patent No.: US 9,423,418 B2
(45) Date of Patent: Aug. 23, 2016

(54) CAPACITIVE SENSOR

(71) Applicant: GOOGLE TECHNOLOGY HOLDINGS LLC, Mountain View, CA (US)

(72) Inventors: Rachid M Alameh, Crystal Lake, IL (US); Patrick J Cauwels, South Beloit, IL (US); Steve C Emmert, McHenry, IL (US); Kenneth A Paitl, West Dundee, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 752 days.

(21) Appl. No.: 13/776,103

(22) Filed: Feb. 25, 2013

(65) Prior Publication Data
US 2014/0239984 A1  Aug. 28, 2014

(51) Int. Cl.
*G01R 27/26* (2006.01)
*G01R 1/04* (2006.01)
*G01D 5/24* (2006.01)
*H03K 17/955* (2006.01)

(52) U.S. Cl.
CPC .. *G01R 1/04* (2013.01); *G01D 5/24* (2013.01); *H03K 17/955* (2013.01); *H03K 2217/94026* (2013.01); *H03K 2217/960705* (2013.01); *H03K 2217/960765* (2013.01)

(58) Field of Classification Search
CPC .... G01R 27/2605; G01R 1/04; G01N 1/0416; H01Q 1/38; G01N 2333/255
USPC .......... 324/686–688, 600, 548, 519, 500, 522
See application file for complete search history.

(56) References Cited

U.S. PATENT DOCUMENTS 5,159,713 A   10/1992   Gaskill et al.
5,412,327 A   5/1995    Meinen
(Continued)

FOREIGN PATENT DOCUMENTS

WO   2009002007 A1   12/2008
WO   2014/130188 A1   8/2014
WO   2014130186 A1   8/2014

OTHER PUBLICATIONS

Non-Final Office Action for U.S. Appl. No. 13/776,099, mailed Oct. 7, 2014, 8 pages.
(Continued)

*Primary Examiner* — Melissa Koval
*Assistant Examiner* — Trung Nguyen
(74) *Attorney, Agent, or Firm* — Shumaker & Sieffert, P.A.

(57) ABSTRACT

One example disclosed wearable device includes a first housing portion having a conductive section and a non-conductive section. The conductive section is connected to ground. A second housing portion includes a printed circuit board (PCB) with a conductor on the PCB surface positioned beneath the non-conductive section. The conductor on the PCB surface and the conductive section form a capacitor of a capacitive sensor. The wearable device may also include a first adhesive layer between a surface of the non-conductive section of the first housing portion and the PCB surface. A second adhesive layer, coplanar with the first adhesive layer, may be applied between a surface of the conductive section of the first housing portion and the PCB surface. The first adhesive layer and the second adhesive layer form a water tight seal that prevents liquids from penetrating into at least the second housing portion.

19 Claims, 11 Drawing Sheets

(56) References Cited

U.S. PATENT DOCUMENTS

| | | | | |
|---|---|---|---|---|
| 6,350,055 | B1* | 2/2002 | Barras | 368/281 |
| 6,657,595 | B1 | 12/2003 | Alameh et al. | |
| 7,474,592 | B2 | 1/2009 | Lyon | |
| 8,107,878 | B2 | 1/2012 | Alameh et al. | |
| 2002/0125556 | A1* | 9/2002 | Oh et al. | 257/685 |
| 2003/0123329 | A1 | 7/2003 | Guanter et al. | |
| 2007/0032967 | A1 | 2/2007 | Feen et al. | |
| 2007/0209443 | A1 | 9/2007 | Yoshikawa et al. | |
| 2007/0291016 | A1 | 12/2007 | Philipp | |
| 2009/0066674 | A1 | 3/2009 | Maharyta et al. | |
| 2009/0211533 | A1* | 8/2009 | Sprung | 119/264 |
| 2011/0043227 | A1 | 2/2011 | Pance et al. | |
| 2011/0133932 | A1* | 6/2011 | Tan et al. | 340/568.1 |
| 2011/0140935 | A1 | 6/2011 | Anorozo | |
| 2012/0099406 | A1 | 4/2012 | Lau et al. | |
| 2012/0194976 | A1* | 8/2012 | Golko et al. | 361/679.01 |
| 2012/0217982 | A1 | 8/2012 | Narayanasamy et al. | |
| 2013/0003034 | A1* | 1/2013 | Verburg et al. | 355/67 |
| 2013/0120005 | A1* | 5/2013 | Magnusson et al. | 324/686 |
| 2013/0234910 | A1* | 9/2013 | Oh et al. | 343/872 |
| 2014/0239982 | A1 | 8/2014 | Alameh et al. | |

OTHER PUBLICATIONS

Notice of Allowance for U.S. Appl. No. 13/776,099, mailed Mar. 19, 2015, 7 pages.
International Search Report and Written Opinion for International Application No. PCT/US2014/012251, mailed Apr. 11, 2014, 7 pages.
International Search Report and Written Opinion for PCT Application No. PCT/US2014/012255, mailed Jun. 25, 2014, 11 pages.
Jun Rekimoto, GestureWrist and GesturePad: Unobtrusive Wearable Interaction Devices, IEEE Proceedings, Fifth International Symposium on Wearable Computers, 1530-0811/01, pp. 21-27 (IEEE 2001).
Quantum Research Group, Secrets of Successful QTouch Design, Application Note AN-KD02 Rev 1.03 (QRG Ltd. 2005), available at: http://www.atmel.com/Images/an-kd02_103-touch_secrets.pdf.
Pushek Madaan, Priyadeep Kaur, Capacitive Sensing Made Easy, Part 1: An Introduction to Different Capacitive Sensing Technologies, (EE Times Apr. 16, 2012), available at: http://www.eetimes.com/design/Industrial-control/4371081/An-introduction-to-Capacitive-Sensing-Part-I; also available at http://www.cypress com/?docID=36129.
SmartSense, Cypress Perform (Cypress Semiconductor Corp 2013), available at: http://www.cypress com/?id=2014.
SmartSense Tuning, Cypress Perform (Cypress Semiconductor Corp. Jun. 13, 2012), available at http://www.cypress.com/?id=4&rID=57554.
Marguerite Reardon, Will 2013 be the Year of the SmartWatch?, (CNET News Jan. 12, 2013), available at: http://news.cnet.com/8301-1035_3-57563407-94/will-2013-be-the-year-of-the-smartwatch/.
International Preliminary Report on Patentability from International Application No. PCT/US2014/012255, mailed Sep. 3, 2015, 8 pp.

* cited by examiner

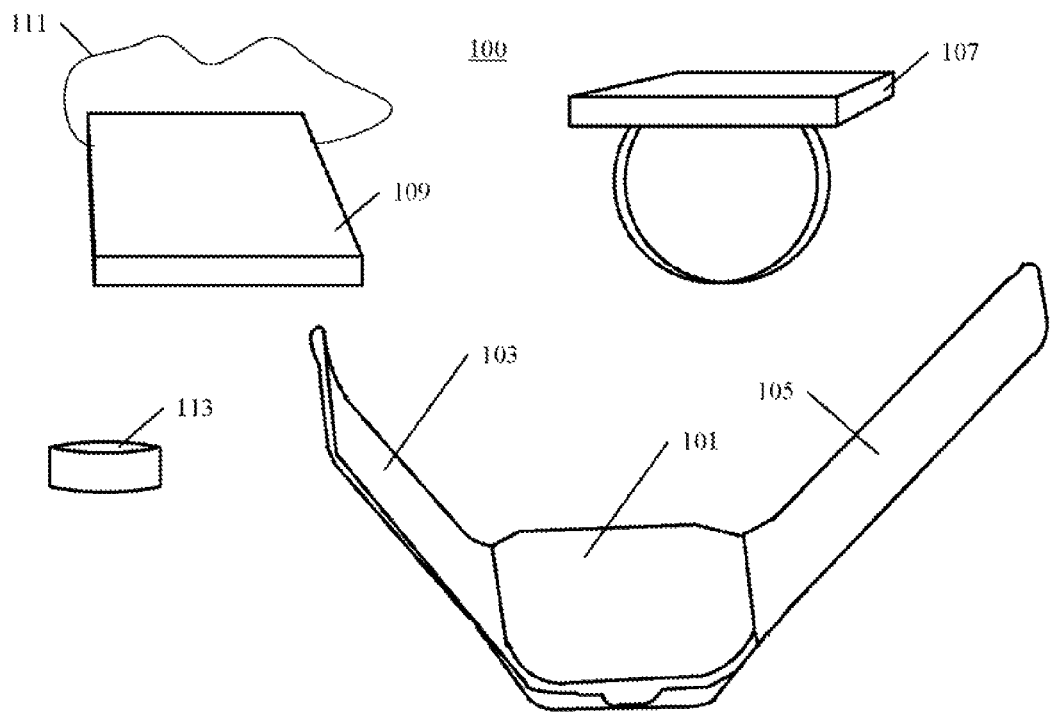
FIG. 1
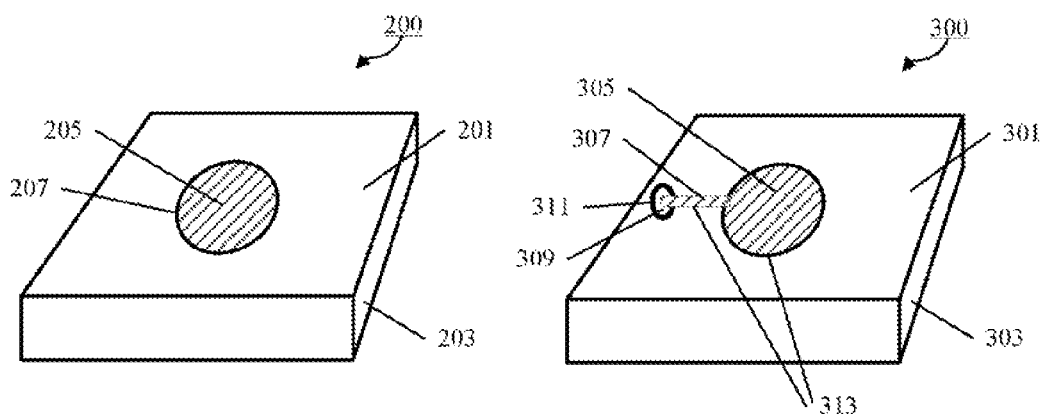
FIG. 2
FIG. 3

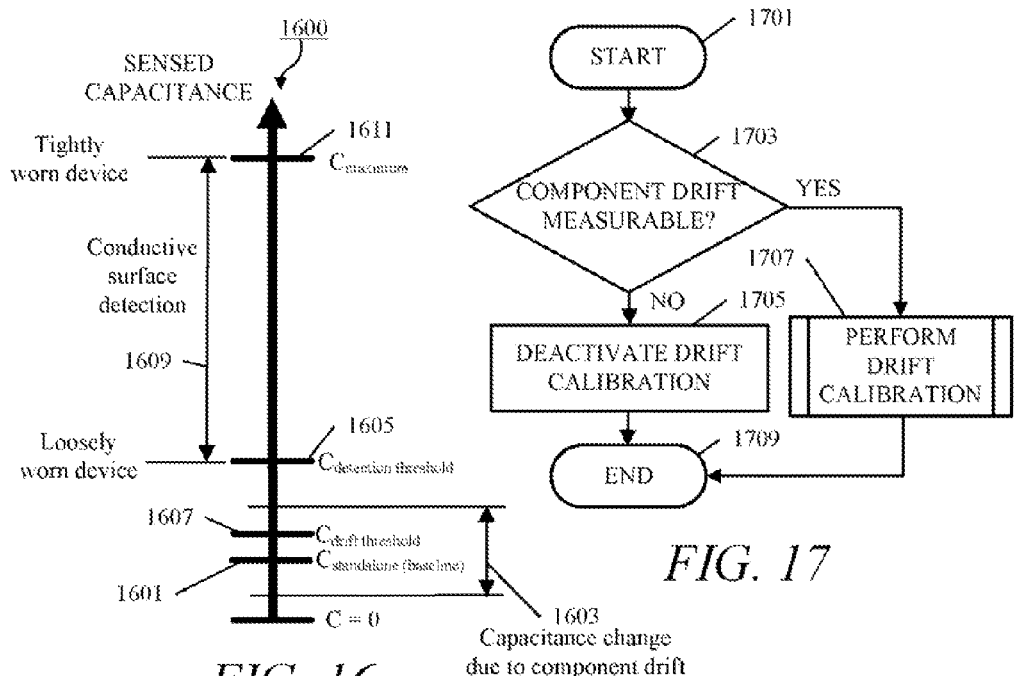
FIG. 16
FIG. 17
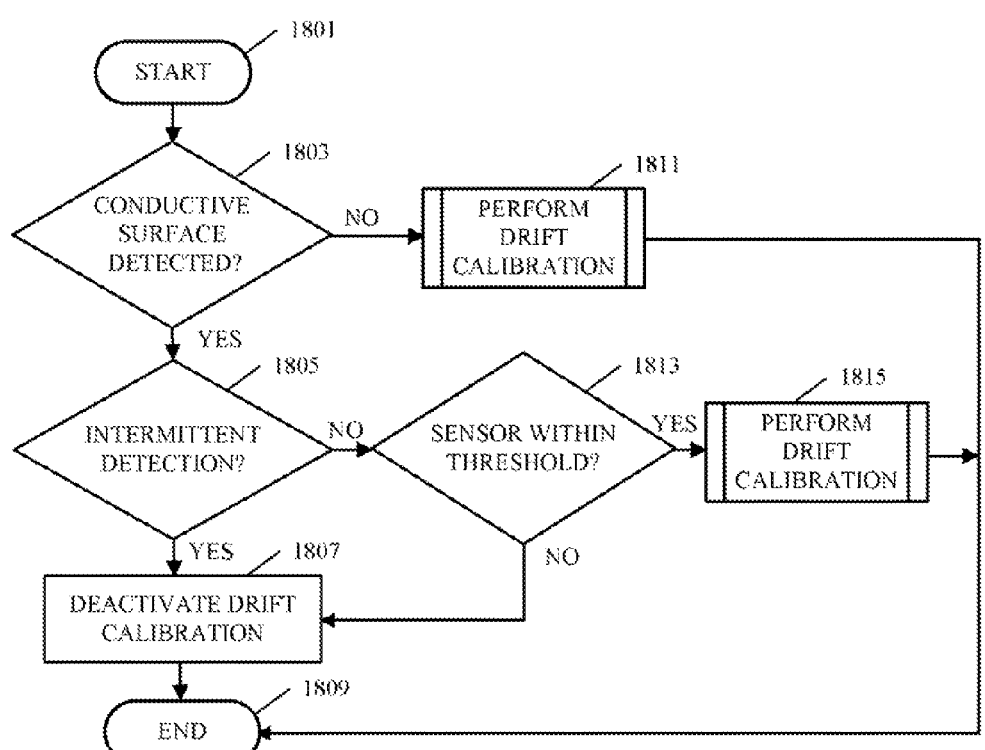
FIG. 18

CAPACITIVE SENSOR

CROSS-REFERENCE TO RELATED APPLICATIONS

The present disclosure is related to co-pending U.S. Pat. App. No. 13/776,099 "WEARABLE DEVICE WITH CAPACITIVE SENSOR AND METHOD OF OPERATION THEREFOR," which is hereby incorporated by reference herein.

FIELD OF THE DISCLOSURE

The present disclosure relates generally to wearable devices and more particularly to capacitive sensor components and circuits.

BACKGROUND

As mobile devices decrease in size due to continuing advances in miniaturization technologies, some have become "wearable devices" in the sense that these devices may be worn by a user as a fashion accessory such as jewelry, an article of clothing, a portion of an article of clothing, etc. Because of the reduced size of these wearable devices, adding intelligent capabilities becomes challenging due to the limited space available for various sensors.

BRIEF DESCRIPTION OF THE DRAWINGS

FIG. 1 is a diagram showing examples of wearable devices.

FIG. 2 is an axonometric diagram of a wearable device having a capacitive sensor in accordance with an example embodiment.

FIG. 3 is an axonometric diagram of a wearable device having a capacitive sensor in accordance with an example embodiment.

FIG. 16 is a graph illustrating the usage of sensed capacitance values in accordance with various embodiments.

FIG. 17 is a flow chart showing a method of operation in accordance with an embodiment.

FIG. 18 is a flow chart showing a method of operation in accordance with some embodiments.

DETAILED DESCRIPTION

Figure 4:
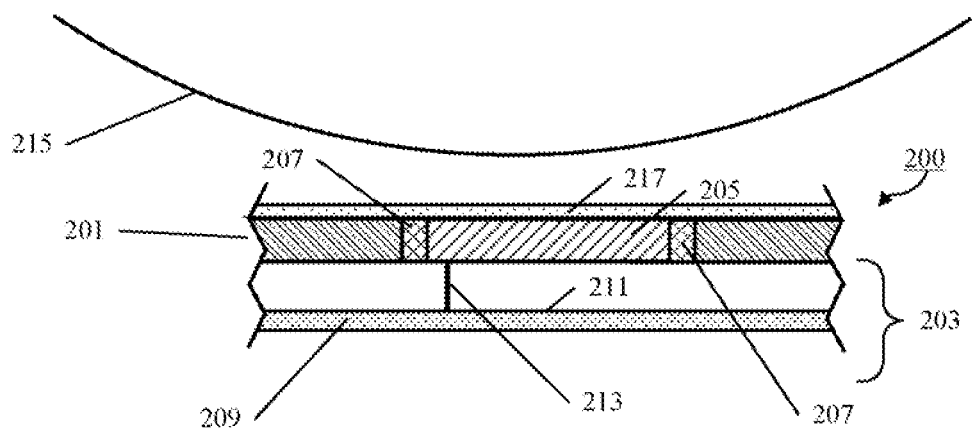
FIG. 4 is one example cross-sectional view of a wearable device similar to that shown in FIG. 2.

The present disclosure provides one example wearable device that has a first housing portion with a conductive section and a non-conductive section. The conductive section is connected to ground. A second housing portion includes a printed circuit board (PCB) with a conductor on the PCB surface positioned beneath the non-conductive section. The conductor on the PCB surface and the conductive section form a capacitor of a capacitive sensor. A first adhesive layer may be applied between a surface of the non-conductive section of the first housing portion and the PCB surface. A second adhesive layer, coplanar with the first adhesive layer, may be applied between a surface of the conductive section of the first housing portion and the PCB surface, such that the first adhesive layer and the second adhesive layer form a water tight seal that prevents liquids from penetrating into at least the second housing portion.

A tolerance gap may be present between adjacent edges of the first adhesive layer and the coplanar second adhesive layer, to allow coplanar expansion of the first adhesive layer or the second adhesive layer due to temperature or pressure.

In some embodiments, the wearable device also includes a conductive shield, formed as a layer of the PCB. The wearable device includes capacitive sensor circuitry, operatively coupled to the conductor on the PCB surface. The capacitive sensor circuitry is operative to drive a voltage of the conductor on the PCB surface to create a capacitive charge between the conductor on the PCB surface and the conductive section of the first housing portion. The capacitive sensor circuitry is also operative to drive a shield layer of the PCB to the same voltage as the conductor on the PCB surface when a shield is used.

In some embodiments, the first housing portion conductive section has a cutout or bore and the non-conductive section is fitted within the cutout or bore. An interference fit or press fit may be used to dimension the non-conductive section to fit within the cutout or bore. In some embodiments, a non-conductive insulator, such as a grommet, may be used between an outer perimeter of the non-conductive section and the conductive section.

In one example embodiment, a grommet has a t-shaped cross-section with an axially extending cylindrical portion, and a radial disc portion connected to the axially extending cylindrical portion.

Another example wearable device includes a first housing portion that has first and second conductive sections separated by a non-conductive insulator. The first conductive section is connected to ground. The second housing portion includes a PCB. The second conductive section is operatively coupled to the PCB and the first and second conductive sections form a capacitor of a capacitive sensor.

The first housing portion may have a cutout or bore within the first conductive section where the second conductive section is fitted within the cutout or bore together with a non-conductive insulator that surrounds the outer perimeter of the second conductive section. Capacitive sensor circuitry is operatively coupled to the PCB and to the second conductive section. The capacitive sensor circuitry is operative to drive a voltage of the second conductive section to create a capacitive charge between the second conductive section and the first conductive section of the first housing portion.

Another example wearable device includes a first non-conductive housing portion and a second housing portion that includes a PCB with a conductor on the PCB surface positioned beneath the non-conductive housing portion. A ground conductor and the conductor on the PCB surface form a capacitor of a capacitive sensor. The ground conductor may be positioned on an outer surface of the first non-conductive housing portion. Alternatively, the ground conductor may be positioned on a wristband segment that is attached to the wearable device housing.

Another example wearable device includes a first wristband segment and a second wristband segment connected to the housing. A first conductor is positioned on the first wristband segment and second conductor is positioned on the second wristband segment. The first conductor and the second conductor form a capacitor of a capacitive sensor.

Another example wearable device includes a housing having a wristband connected to the housing, with a first conductor positioned on the wristband and a second conductor positioned on the housing. The first conductor and the second conductor form a capacitor of a capacitive sensor.

Turning now to the drawings wherein like numerals represent like components, FIG. 1 is a diagram showing example wearable devices 100. A wearable device may include any suitable structure and therefore the possible wearable devices are not limited to the example wearable devices 100 shown in FIG. 1. The example wearable devices 100 include a medallion or pendant 109 attached to a lanyard or chain 111, a ring 107, a wristwatch 101 having wristband segments 103 and 105, and a button or brooch 113 which may include a pin (not shown) for attaching to clothing. Alternatively the button or brooch 113 may be sewn to clothing such as a shirt or blouse button, etc. Other example wearable devices may include an anklet, a belt buckle, etc.

Axonometric diagrams of wearable devices having a capacitive sensor in accordance with example embodiments are shown in FIG. 2 and FIG. 3. The example embodiments shown in FIG. 2 and FIG. 3 may be implemented as any of the example wearable devices 100 shown in FIG. 1 or any other suitable wearable device. In the example embodiment of FIG. 2, a wearable device 200 includes a housing 203 and a conductive cover 201 which is connected to ground. Although the housings in FIG. 2 and FIG. 3 are shown as rectangular for example purposes, it is to be understood that the housing of a wearable device may have any suitable shape. A sensor conductor 205 is fitted into a circular cutout portion of the housing 203 and is isolated from the conductive cover 201 using a non-conductive insulating ring 207 which surrounds the perimeter of sensor conductor 205 which is likewise circular. The circular shape of the sensor conductor 205 is only an example in that the sensor conductor 205 may have any of various shapes such as square, rectangular, triangular, octagonal, hexagonal, or some other shape or design. The sensor conductor 205 and the grounded conductive cover 201 serve as self-capacitance capacitive sensor components and are coupled to other capacitive sensor components which form circuitry of the capacitive sensor located within the housing 203. That is, a self-capacitance capacitive sensor senses a capacitance where the sensor conductor forms one "plate" (i.e. one conductive surface) of a capacitor and a second conductive surface in proximity to the sensor conductor (such as the user's skin, i.e. a finger, a wrist, etc.) forms the other "plate" of the capacitor. The second conductive surface must also be in proximity to ground such that earth ground is coupled to battery ground of the capacitive sensor in order to complete the circuit.

Another example embodiment is the wearable device 300 shown in FIG. 3. The wearable device 300 also includes a housing 303 and conductive cover 301. In the example of FIG. 3, the sensor conductor 305 includes a conductive connection line 307 which extends from the sensor conductor 305 to an aperture 309. The aperture 309 is insulated from the conductive cover 301 by way of an insulating grommet 311. The sensor conductor 305 and the conductive connection line 307 are both insulated from the conductive cover 301 by a non-conductive insulating material 313 such as an insulating tape. The insulating tape may be, for example, a polyimide material or any other suitable non-conductive insulating material. The surfaces of the sensor conductor 205, and sensor conductor 305 and conductive connection line 307, will also be covered by a non-conductive layer such as, but not limited to, a non-conductive coating, a non-conductive tape or laminate, etc.

In the examples of both FIG. 2 and FIG. 3, in some embodiments, the respective cover 201 and cover 301 may form part of the respective housings and therefore may be considered to be more like a section or portion of the housing rather than a "cover." That is, a "cover" as discussed herein may be removable, or not removable, and may be a half or other portion of a wearable device housing such that the "cover" may contain some components of the wearable device (including components of a capacitive sensor) and the "housing" or other portion of the housing may contain other components of the wearable device. In other words, a "housing" and "cover" as used herein may be considered to be housing portions, such as first and second housing portions, that form an enclosure that contains the components of a wearable device. The enclosure may be sealed such that the housing and cover are not separable, or, the cover may be removable to access internal components such as an internal battery that may be replaceable, a memory card, or some other component. Put another way, the housing is an enclosure that has a first portion and a second portion, where one of the first portion or the second portion may be considered to be a cover of the housing or enclosure.

Figure 5:
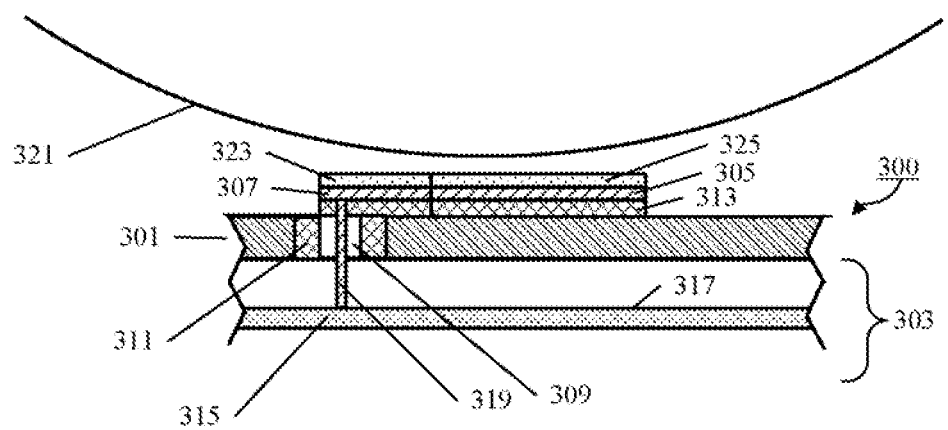
FIG. 5 is one example cross-sectional view of a wearable device similar to that shown in FIG. 3.

Cross-sectional views of the wearable device 200 and wearable device 300 are provided in FIG. 4 and FIG. 5, respectively. The sensor conductor 205, which is surrounded by the non-conductive insulating ring 207, may be press fit or otherwise have an interference fit into a circular cutout portion of the conductive cover 201 to form the cross section as shown in FIG. 4. A non-conductive layer 217 may be applied as a coating or may be some other suitable non-conductive material. Within the housing 203, and below the conductive cover 201, is a printed circuit board (PCB) 209 which may be a flexible circuit board. A connection wire 213, or some other suitable connection, forms an electrical connection between the sensor conductor 205 and an appropriate trace line on the PCB surface 211. Although a connection wire 213 is shown in the example of FIG. 4, a suitable connection may be formed using other means such as, but not limited to, a section of flexible PCB, a segment of conductive tape, a conductive spring, a spring contact such as a spring loaded pin contact, or any other suitable type of electrical connection. An air gap may be present between the PCB surface 211 and the bottom surface of the conductive cover 201 in some embodiments however some non-conductive insulating material may be present.

When the capacitive sensor is operating, parasitic capacitance will exist between at least the perimeter of the sensor conductor 205 and the conductive cover 201 due to the gap between the sensor conductor 205 and the conductive cover 201 which is filled by the non-conductive insulating ring 207. Additional parasitic capacitance may also exist between the sensor conductor 205 and trace lines on the PCB surface 211. When a conductive surface 215 comes within proximity of the sensor conductor 205, or in contact with the surface of the non-conductive layer 217, an additional capacitance is formed between the conductive surface 215 and the sensor conductor 205 thereby affecting the overall capacitance seen by the capacitive sensor. The conductive surface 215 may only come within proximal distance of the sensor conductor 205 and conductive cover 201 or may come into contact with the surface of non-conductive layer 217 to produce various capacitance values sensed by the capacitive sensor.

The cross-sectional view of the wearable device 300 illustrated in FIG. 5 shows the sensor conductor 305 and the conductive connection line 307 positioned on top of the non-conductive insulating material 313. As discussed above, the non-conductive insulating material 313 may be any suitable non-conductive insulating material such as a polymer and may be a polyimide such as a polyimide tape or laminate. The sensor conductor 305 and the conductive connection line 307 are also covered by non-conductive material segments 325 and 323, respectively, which may also be formed from a polyimide tape or laminate or may be a non-conductive coating material. In some embodiments, the non-conductive covering material, which may be a coating, may cover the entire surface of the conductive cover 301 including the sensor conductor 305 and conductive connection line 307. The conductive connection line 307 extends from the sensor conductor 305 up to some suitable position above the aperture 309 so that the conductive connection line 307 either continues through the aperture 309 or is further connected, by for example connection wire 319, to an appropriate trace on the PCB surface 317 of PCB 315. The connection wire 319 may either be an extension of the conductive connection line 307, a segment of conductive tape, a flexible connection line or piece of flexible PCB, a conductive spring, a spring contact such as a spring loaded pin contact, or any other suitable type of electrical connection. The conductive cover 301 is connected to circuit ground within the housing 303. Similar to the example illustrated in FIG. 4, and air gap may exist between the bottom surface of the conductive cover 301 and PCB surface 317, or alternatively, some non-conductive insulating material may be present. The capacitive sensor again may be actuated by a conductive surface 321 coming within a proximal distance of the sensor conductor 305 and conductive cover 301, or into contact with one or both of the non-conductive material segments 323 and 325. The conductive surface 321 may also come into full contact with the surface of a non-conductive layer or coating that covers the entirety of the sensor conductor 305 and conductive cover 301 as was discussed above.

Figure 6:
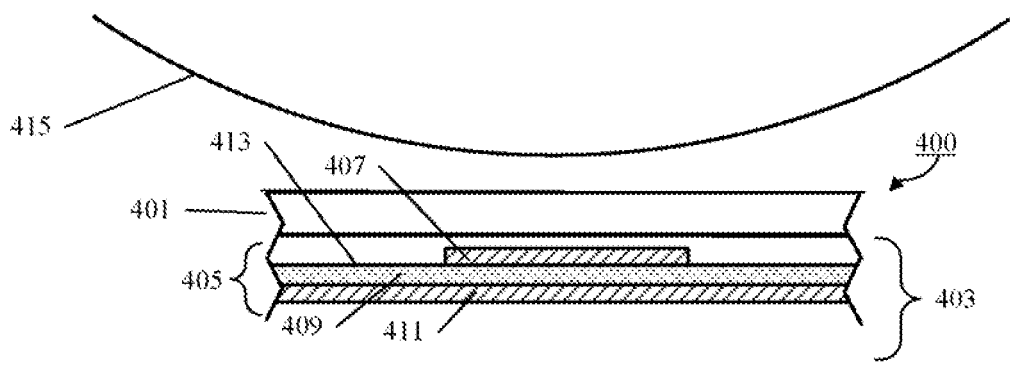
FIG. 6 is an example cross-sectional view of a wearable device in accordance with embodiments that are alternative to those shown in FIG. 4 and FIG. 5.

Another example embodiment is illustrated by the cross-section of wearable device 400 shown in FIG. 6. The wearable device 400 includes a multi-layer PCB 405 which may be a double-sided PCB or some other type of multi-layer PCB, which may be a flexible PCB, and which is positioned within the housing 403. A sensor conductor 407, which may be circular or some other shape, is formed as a conductive trace on the PCB surface 413 of multi-layer PCB 405. On the opposite side of a non-conductive layer 409 is a shield 411 which is formed by a conductive plane such as a copper plane. The shield 411 is a driven shield which is driven to the same potential as the sensor conductor 407 to protect against coupling or interference with any circuit or other components physically located below the multi-layer PCB 405 within the housing 403. A non-conductive cover 401 is situated above the multi-layer PCB 405 and may also be a cover of the housing 403. The non-conductive cover 401 may be formed from any suitable non-conductive material such as, but not limited to, a thermoplastic polymer and may be a polycarbonate material in some embodiments. The bottom surface of the non-conductive cover 401 may directly contact the sensor conductor 407 surface or an air gap may be present in some embodiments. The capacitive sensor is activated when a conductive surface 415 comes within a proximal distance of, or in contact with, the top surface of the non-conductive cover 401 such that a capacitance is formed between the conductive surface 415 and the sensor conductor 407. The sensor conductor 407 may be suitably coupled to other capacitive sensor components by trace lines on the PCB surface 413 and/or by PCB via (not shown) penetrating the layers of the multi-layer PCB 405 to couple with other capacitive sensor components forming the capacitive sensor circuitry located within the housing 403.

Figure 7A:
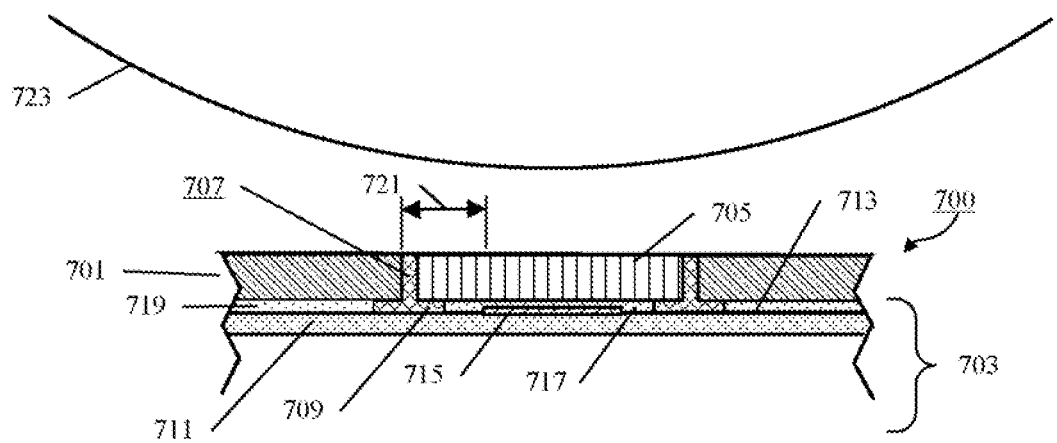
FIGS. 7A, 7B and 7C provide example cross-sectional views of various arrangements that may be used in wearable devices such as those shown in FIG. 2 and FIG. 9.
Figure 7B:
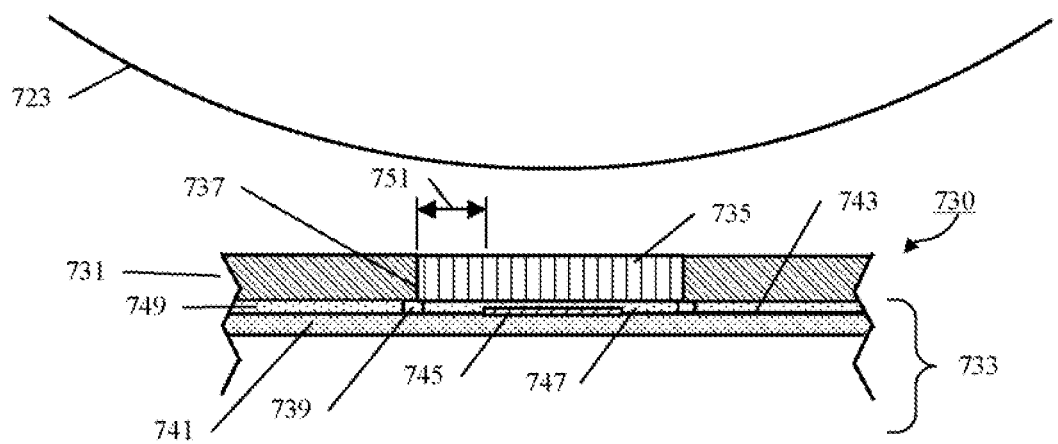
Figure 7C:
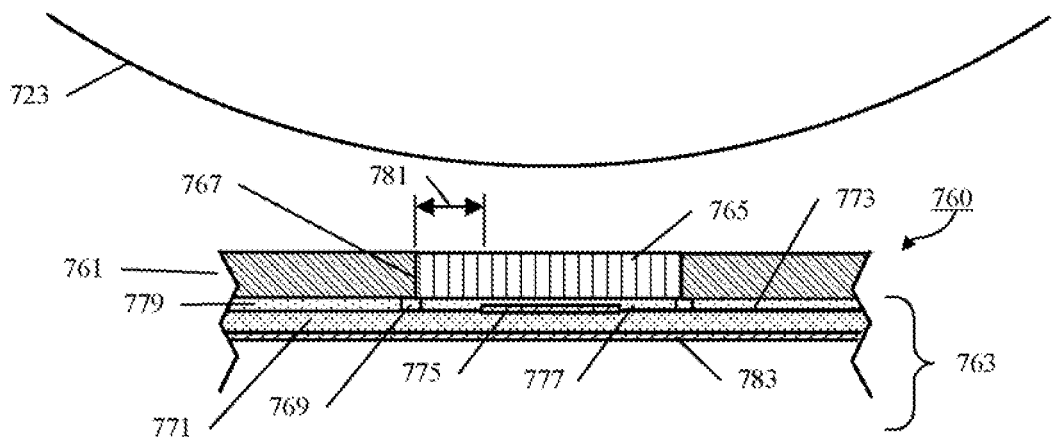
Figure 8:
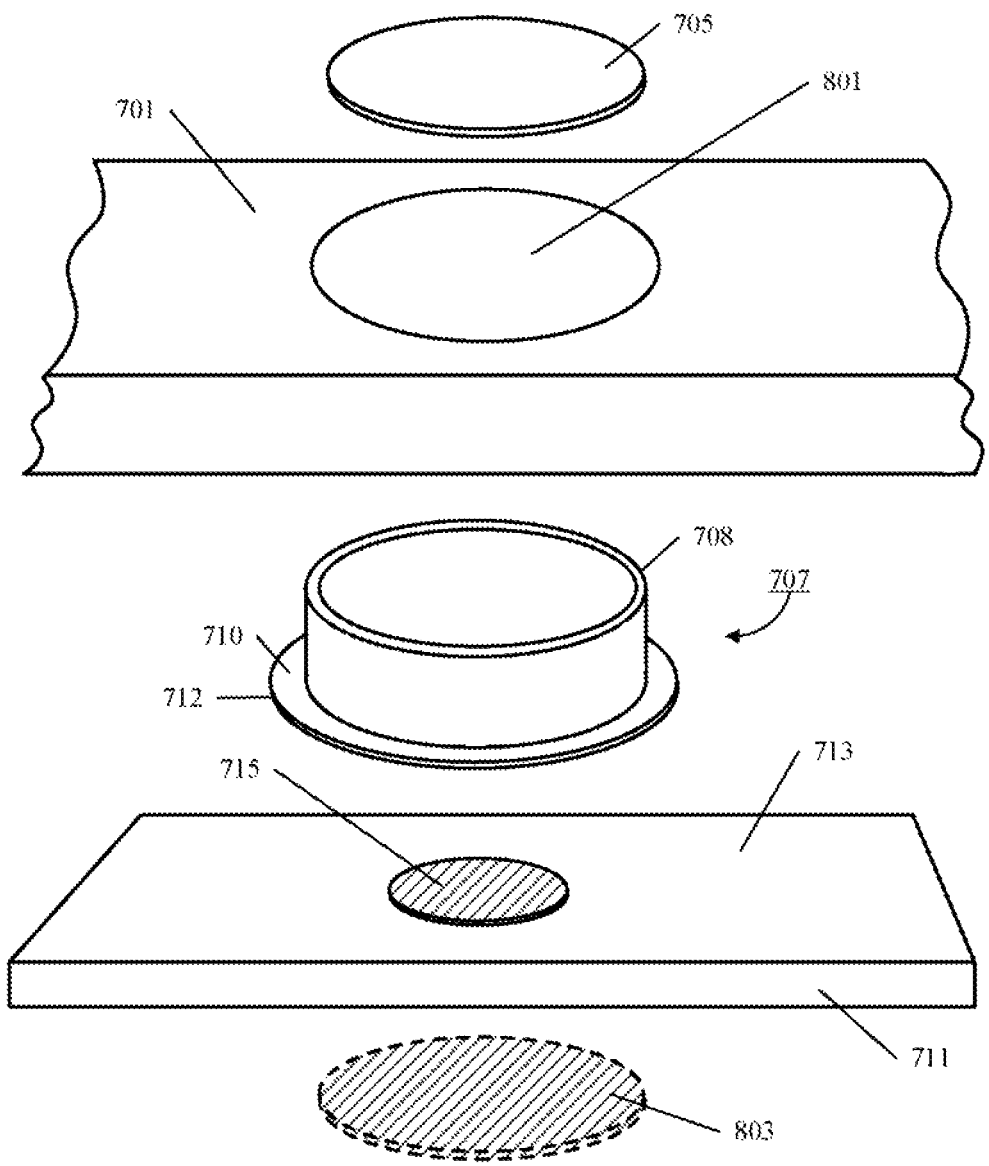
FIG. 8 is an example assembly diagram of the wearable devices shown in the cross-sectional views of FIG. 7 such as FIG. 7A.
Figure 9:
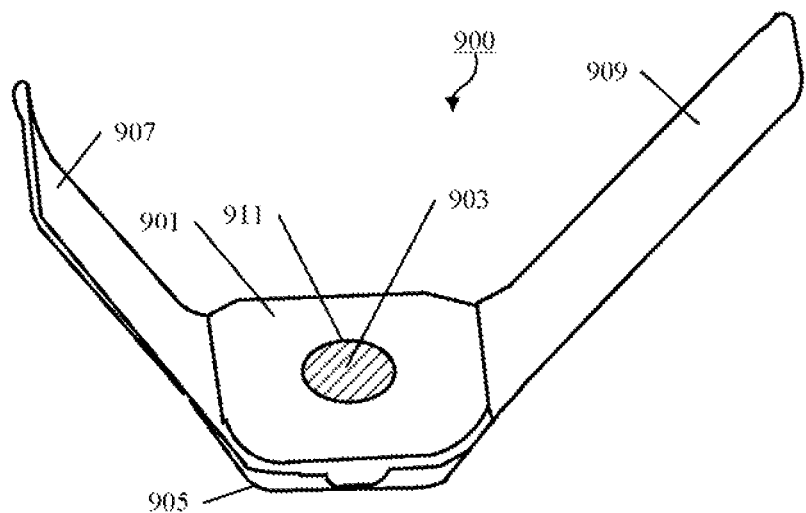
FIG. 9 is an axonometric diagram of a wristwatch as an example wearable device having a capacitive sensor in accordance with an embodiment.

Other example embodiments are illustrated in FIGS. 7A, 7B and 7C by the cross-sectional views of respective wearable devices 700, 730 and 760. An example assembly view is also provided n FIG. 8, to shown further example details of the wearable device 700 shown in FIG. 7A. In FIG. 7A and FIG. 8, a non-conductive, decorative medallion 705 is fitted into a cutout or bore 801 of a conductive cover 701 that covers a housing 703 of wearable device 700. The decorative medallion 705 is "decorative" in that it may include a design on its surface such as, but not limited to, a company logo, a user's initials, or some other design, etc. In the example of FIG. 7A, the decorative medallion 705 is secured into the cutout or bore 801 using a non-conductive, insulating grommet 707 and an adhesive 717 which forms an adhesive layer that secures the decorative medallion 705 to the PCB surface 713. The PCB 711 may be a flexible PCB and may be a single layer or multi-layer PCB in the various embodiments. The adhesive is non-conductive and may be an epoxy, such as an epoxy resin or some other suitable non-conductive adhesive formulation, or may be a non-conductive adhesive tape. One example of a non-conductive adhesive tape may be a double coated tape with a pressure sensitive adhesive on one side and an acrylic adhesive on the other side. In some embodiments, the tape may be formed using a polyester film carrier and have the coatings described above.

The insulating grommet 707 has a T-shaped cross-section as shown and has an appropriate shape so that it surrounds the perimeter of the decorative medallion 705. For example, the insulating grommet 707 may be circular for embodiments in which the cutout or bore 801 and decorative medallion 705 are circular. However, the insulating grommet 707 may be any suitable shape such as, but not limited to, oval, triangular, rectangular, square, hexagonal, octagonal, or some other shape etc. so as to fit, and provide electrical insulation and a water seal for, like-shaped decorative medallions. That is, the decorative medallion 705 may also be any shape. The example insulating grommet 707 includes an axially extending cylindrical portion 708 that extends from a radial disc portion 712. The axially extending cylindrical portion 708 has an inner diameter suitable to form an interference fit with the outer diameter of the decorative medallion 705. The outer diameter of the axially extending cylindrical portion 708 inserts into the cutout or bore 801 and is sized to form an interference fit therewith. A bottom surface of the radial disc portion 712 is seated on the PCB surface 713 and may also be secured using an adhesive. The radial disc portion 712 includes a radially inwardly extending portion 709 on which the decorative medallion 705 is seated and which forms a water tight seal, along with adhesive 717, between the decorative medallion 705 and the PCB 711. The conductive cover 701 is seated on a radially outwardly extending portion 710 which also forms a water tight seal, along with adhesive 719, between the conductive cover 701 and the PCB 711.

The adhesive 719 surrounds at least the outer perimeter of the radially outwardly extending portion 710 and forms an adhesive layer between the bottom surface of the conductive cover 701 and the PCB surface 713, and helps secure the conductive cover 701 to the PCB surface 713. The adhesive layer formed by adhesive 717 and the adhesive layer formed by adhesive 719 are coplanar, and may be separated only by a portion of the grommet 707 that contacts the same respective surfaces. That is, the adhesive 717 fills the circular area formed by the inner circumference of the radially inwardly extending portion 709 and forms an adhesive layer between the bottom surface of the decorative medallion 705 and the PCB surface 713, and also helps secure the decorative medallion 705 to the PCB surface 713. As mentioned above, the insulating grommet 707, along with the adhesive layers formed by adhesives 717 and 719, form water tight seals that prevent water or other liquids from seeping around the cutout or bore 801 and getting onto the PCB surface 713 or into the housing 703. The insulating grommet 707 may be formed from a suitable elastomeric material such as a suitable synthetic rubber and may be flexible material. The adhesives 717 and 719 may be the same adhesives, that is, an epoxy, such as an epoxy resin or some other suitable non-conductive adhesive formulation as discussed above.

A sensor conductor 715 is positioned on the PCB surface 713, beneath the decorative medallion 705, and may also be covered by the adhesive 717. The sensor conductor 715 may be circular as shown in the example of FIG. 8, and is formed from copper conductor on the PCB surface 713. In other examples, the sensor conductor 715 may be any shape such as, but not limited to, oval, triangular, rectangular, square, hexagonal, octagonal, or some other shape etc. The sensor conductor 715 may be coupled to other circuitry using copper trace lines along the PCB surface 713, and/or by via running through one or more layers of the PCB 711.

The cross-sectional views of FIGS. 7B and 7C illustrate examples that do not use the insulating grommet 707. In FIG. 7B the wearable device 730 includes a decorative medallion 735 fitted into a cutout or bore of a conductive cover 731 with an interference fit 737 between the perimeter of the decorative medallion 735 and the inner surface or the conductive cover 731 cutout or bore. The conductive cover 731 covers a housing 733 which contains PCB 741 which may be a flexible PCB and may have one or more layers. The PCB surface 743 of PCB 741 includes a sensor conductor 745 which may have any shape. The decorative medallion 735 is secured to the PCB surface 743 by an adhesive layer formed by adhesive 747 which may cover the surface of sensor conductor 745. The cover 731 is also secured to the PCB surface 743 by adhesive 749 which forms an adhesive layer that is coplanar with the adhesive layer formed by adhesive 747. A tolerance gap 739 may be present between the adhesive layers formed by adhesives 749 and 747 to allow for expansion of the adhesives due to, for example, temperature or pressure, or other conditions. The adhesives 747 and 749 are the same type as discussed for FIG. 7A above.

The example wearable device 760 shown in FIG. 7C has the same features as the wearable device 730 and therefore includes a decorative medallion 765 fitted into a cutout or bore of a conductive cover 761 with an interference fit 767 between the perimeter of the decorative medallion 765 and the inner surface or the conductive cover 731 cutout or bore. Adhesive 777 secures the decorative medallion 765 to the PCB surface 773 of PCB 771. In this example, PCB 771 is a multi-layer flexible PCB and includes a shield 783 which is formed by a conductive layer on a PCB surface opposite the sensor conductor 775. Like the example provide in FIG. 6, the shield 783 is a driven shield which is driven to the same potential as the sensor conductor 775 to protect against coupling or interference with any circuit or other components physically located below the multi-layer PCB 771 within the housing 763. Adhesive 779 secures the conductive cover 761 to the multi-layer PCB 771 to cover the housing 763 and forms an adhesive layer that is coplanar to the adhesive layer formed by adhesive 777. A tolerance gap 769 may be present between the adhesive layers formed by adhesives 777 and 779 to allow for expansion of the adhesives due to, for example, temperature or pressure, or other conditions. The adhesives shown in both FIG. 7B and FIG. 7C form watertight seals between the respective conductive covers and PCB surfaces to prevent water or other liquid or debris from contaminating the PCB surfaces 743, 773 or from getting into the housings 733, 763. The watertight seal is achieved in the examples of FIG. 7B and FIG. 7C without the need for the grommet 707 shown in the FIG. 7A example. The adhesives 777 and 779 are the same type as discussed for FIG. 7A and FIG. 7B above.

In operation of any of the configurations shown in FIG. 7A, 7B or 7C, a capacitance change is sensed by the respective capacitive sensors when the conductive surface 723 comes within proximity of the sensor conductors 715, 745, 775, or into contact with the surface of the non-conductive decorative medallions 705, 735 or 765. The decorative medallions described above may be considered to be a "section" of the conductive covers, or, in other words, a section of a portion of the wearable device housing. Put another way, the wearable device housings have a first portion that houses a PCB with a sensor conductor, and a second portion that has a conductive section and a non-conductive section. The conductive section of the second portion (such as the cover) is connected to ground. The non-conductive section of the second portion is the decorative medallion which is positioned above or over the sensor conductor on the PCB. The perimeter of the decorative medallion is larger than the perimeter of the sensor conductor such that the sensor conductor perimeter would fit within the perimeter of the decorative medallion.

It is to be understood that the cross-sectional views provided in FIG. 4, FIG. 5, FIG. 6, FIGS. 7A, 7B, and 7C and described herein, are examples only for purposes of describing the arrangement of components relative to one another and are not to scale and illustrate certain components such as the various PCBs in a simplified manner. That is, the various PCBs depicted may consist of multiple layers not shown such as, for example, coverlays formed from polyimide or other suitable non-conductive materials, various adhesive layers, conductive trace layers and sections, various non-conductive layers, via for connecting points on various layers, etc., and such other layers, via, etc., not shown, but where necessary, are understood to be present by those of ordinary skill. Also, the assembly view of FIG. 8 is likewise an example for the purpose of description of components relative to one another, as well as describing some features of the components, and is not to scale.

Some example dimensions will now be provided for an example embodiment related to FIG. 7 and FIG. 8. However, it is to be understood that these dimensions are examples only that are not to be construed as limiting or requirements and that, in light of the disclosure and description provide herein, such dimensions may be modified by those of ordinary skill to arrive at various other contemplated embodiments that have different dimensions and different parasitic capacitances and that such other embodiments are contemplated by the inventors in disclosing such example dimensions. That is, the example dimensions provided are approximate in that they are not only to be understood as being within some mechanical tolerance suitable for the example embodiment, but also may be modified in relation to other components by increased or reduced values that retain the features and functions described herein as contemplated by the disclosed embodiments. Example dimensions in one example embodiment include a distance 721 from the perimeter edge of the sensor conductor 715 to the edge of the internal surface of the cutout or bore 801 of the conductive cover 701. An example distance 721 may be approximately 1.0 mm. Likewise, the distances 751 and 781 may be approximately 1.0 mm. The adhesive layers formed by adhesives 717 and 719 may be approximately 0.05 mm thick between the PCB surface 713 and the bottom surfaces of the decorative medallion and the conductive cover 701, respectively. The conductive cover 701 may have an approximate thickness of 0.3 mm. The decorative medallion 705 may be circular as shown in FIG. 8, but is not limited to being circular, and may have a diameter of approximately 12 mm and a thickness of 0.3 mm. The sensor conductor 715 may be circular and may have a diameter of approximately 10 mm. The PCB 711, which may be a flexible PCB, may have a thickness of approximately 0.1 mm or thicker depending on the number of layers incorporated in the PCB 711. For example, multi-layer PCB 771 which includes shield 783 will be thicker than PCB 711 due to having the additional layer to form shield 783. With respect to the insulating grommet 707, the axially extending cylindrical portion 708 that extends from the radial disc portion 712 as measured from the connected surface of the radial disc portion 712, may have a height of approximately 0.3 mm to match the respective thicknesses of the decorative medallion 705 and the conductive cover 701 as illustrated in the cross-sectional view of FIG. 7. Other relative thicknesses and distances may be used in other embodiments that result in different parasitic capacitances between the various components and that may affect the baseline, untouched capacitance value of the sensor accordingly and any such embodiments are contemplated by the present disclosure. In operation, as a conductive surface 723 gets near to the outer surfaces of the conductive cover 701 and the decorative medallion 705, or like components in FIG. 7B and FIG. 7C, a capacitance change, from an "untouched" standalone capacitance will be sensed using the sensor conductor 715 or sensor conductors 745 and 775 in FIG. 7B and FIG. 7C, respectively.

The example assembly view of FIG. 8 also shows that a shield 803 may also be included and is larger than the perimeter of the sensor conductor 715. In the FIG. 8 example, the shield 803 is circular with a diameter larger than the diameter of circular sensor conductor 715. However, the shield may form a layer that covers an entire surface of the PCB 711 in some embodiments.

Figure 10:
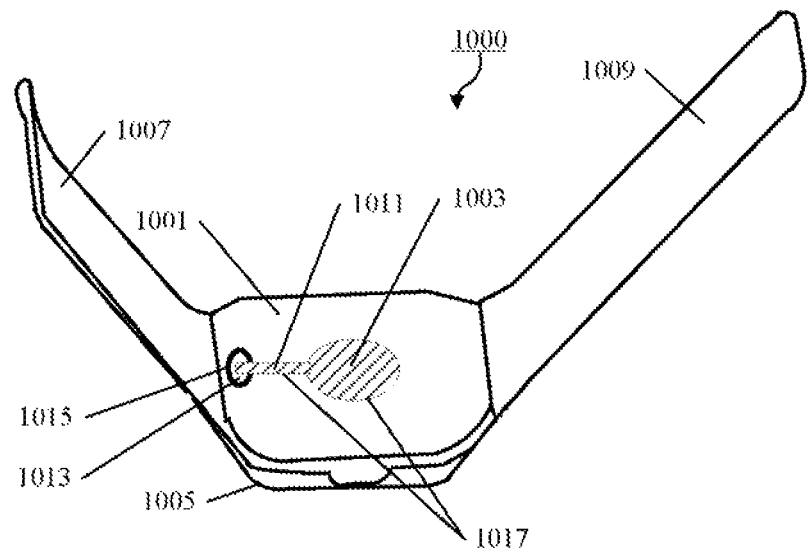
FIG. 10 is an axonometric diagram of a wristwatch as an example wearable device having a capacitive sensor in accordance with an embodiment.

Various additional example embodiments are provided in FIG. 9, FIG. 10, FIG. 11 and FIG. 12. The example embodiment shown in FIG. 9 may employ any of the capacitive sensor configurations shown and described in FIG. 4, FIG. 6, FIGS. 7A, 7B, 7C and FIG. 8. A wristwatch 900 includes two wristband segments 907 and 909 which are attached to a housing 905 and which include a conductive cover 901 which is grounded. In some embodiments, a circular sensor conductor 903 is positioned within a corresponding circular cut-out or bore of the conductive cover 901 and is insulated by a non-conductive insulating ring or grommet 911. When a user places the wristwatch 900 on the user's wrist, and fastens the wristband segment 907 to wristband segment 909, the sensor conductor 903 will sense capacitance due to the user's wrist (which acts as a conductive surface) and will thereby detect that the wristwatch 900 is in use. In other embodiments, the sensor conductor 903 may be located on a PCB beneath the conductive cover 901 such that the sensor conductor 903 is not visible. In such embodiments, a non-conductive, decorative medallion, which may be circular, or some other shape, may be fitted within the cutout as was described with respect to FIGS. 7A, 7B and 7C. In FIG. 10, an example wristwatch 1000 includes a sensor conductor 1003 positioned on a conductive cover 1001 along with a conductive extension line 1011. The conductive extension line 1011 connects the sensor conductor to capacitive sensor components within the housing 1005 using an aperture 1013 which is insulated by an insulating grommet 1015. The conductive extension line 1011 is electrically connected through the aperture 1013 to other capacitive sensor components that form the capacitive sensor circuitry located within the housing 1005. The cross-sectional view shown in FIG. 5 is an example of a configuration that may be used in conjunction with the example wristwatch 1000 shown in FIG. 10. When the wristwatch 1000 user fastens the wristband segment 1007 with the wristband segment 1009 around the user's wrist, the sensor conductor 1003 will form a capacitance with the user's wrist as a conductive surface, and the capacitive sensor will sense a change in capacitance indicating that the wristwatch 1000 is in use. The sensor conductor 1003 and the conductive extension line 1011 are insulated from the grounded conductive cover 1001 via non-conductive insulating material 1017 and are insulated from the user's wrist via a similar non-conductive insulating material or by a non-conductive coating.

Figure 11:
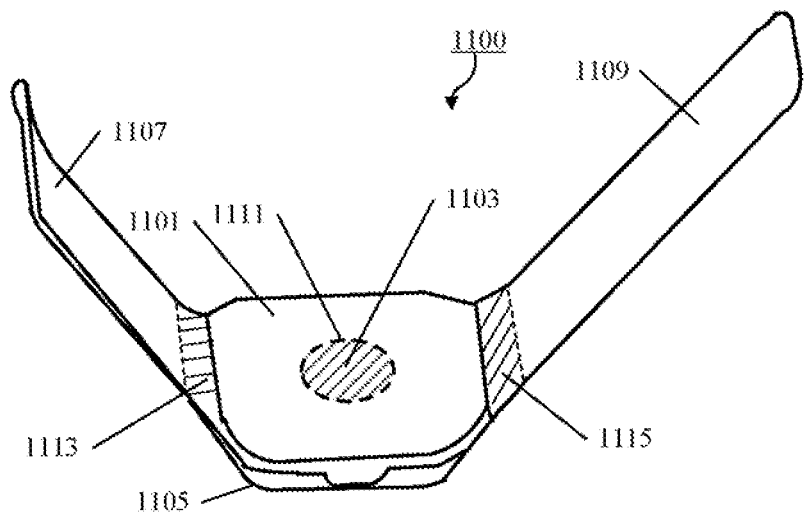
FIG. 11 is an axonometric diagram of a wristwatch as an example wearable device illustrating positions of capacitive sensor components in accordance with various embodiments.
Figure 12:
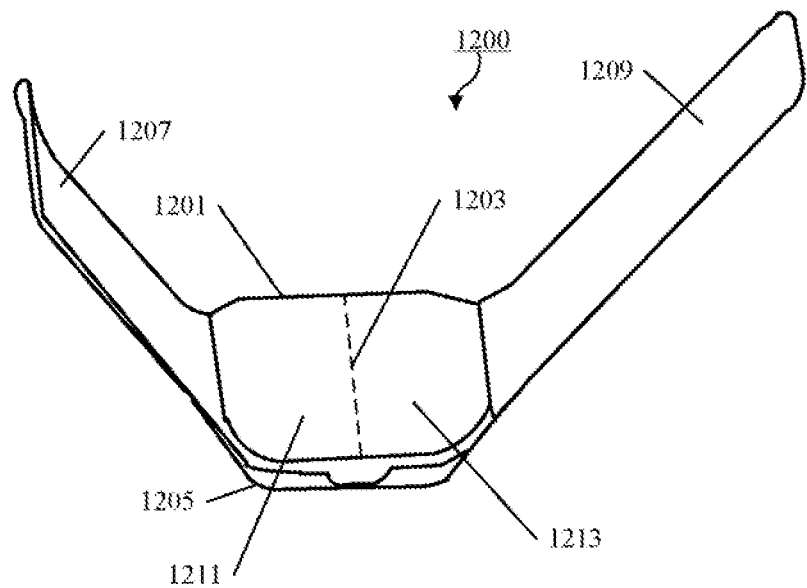
FIG. 12 is an axonometric diagram of a wristwatch as an example wearable device having a capacitive sensor in accordance with some embodiments.

FIG. 11 and FIG. 12 provide additional examples for how the sensor conductor and ground conductor may be configured and positioned in embodiments related to an example wristwatch 1100 and an example wristwatch 1200, respectively. In the example of FIG. 11, various optional possible conductor positions are illustrated by dotted lines. For example, conductor 1103 may be located within a cutout or bore of the cover 1101 which may be a conductive cover in some embodiments. The cover 1101 covers a housing 1105. In another embodiment, the conductor 1103 may be located beneath the cover 1101 such that it is not visible to the user. Examples of such configurations are provided in FIGS. 6, 7A, 7B and 7C which are described in detail above. For example, as shown in FIG. 7A and FIG. 8, the conductor is located beneath a non-conductive, decorative medallion. In embodiments where the cover 1101 is conductive, and where the conductor 1103 is located either embedded in or on top of the cover 1101, an appropriate insulator 1111 may be used to isolate the conductor 1103. A wristband conductor 1113 positioned on wristband segment 1107, or a wristband conductor 1115 positioned on wristband segment 1109, may also be used in some embodiments. That is, any one of conductor 1103, wristband conductor 1113 or wristband conductor 1115 may be used as a sensor conductor while one of the other conductors serves as a ground conductor. For example, conductor 1103 may be used as a sensor conductor and wristband conductor 1113 or wristband conductor 1115 may be used as a ground conductor. Alternatively, one of the wristband conductors 1113 or 1115 may be used as the sensor conductor and the conductor 1103 may be used as the ground conductor. In some embodiments, one of the wristband conductors 1113 or 1115 may be used as the sensor conductor with the other wristband conductor being used as the ground conductor. In yet another alternative embodiment example, one of the wristband conductors 1113 or 1115 may be used as a sensor conductor while the cover 1101, if conductive, may be used as a ground conductor. Therefore it is to be understood that various combinations of the optional conductor positions illustrated in FIG. 11 may be arranged so as to implement a sensor conductor and a ground conductor for purposes of creating a self-capacitance capacitive sensor. Also, in other embodiments, any two of the optional conductor locations shown in FIG. 11 may be used to create a mutual capacitance capacitive sensor with one conductor serving as transmit conductor and another conductor serving as a receive conductor.

The example wristwatch 1200 shown in FIG. 12 includes the housing 1205 which has a wristband segment 1207 and a wristband segment 1209 attached and a cover 1201 which covers the housing 1205. In the example of FIG. 12, cover 1201 is divided into a first section 1211 and a second section 1213 divided as shown by the demarcation line 1203 which is for illustrative purposes only. The first section 1211 and the second section 1213 may both be conductive sections. However, in some embodiments, one section may be conductive and the other section may be non-conductive. In this case, a sensor conductor may be located beneath the non-conductive section and the conductive section may be grounded to create a self-capacitance sensor scheme. In other embodiments, where both sections are conductive, a self-capacitance capacitive sensor scheme may be created by using one of the first or second sections 1211 or 1213 as the sensor conductor and using the other of the two conductive sections as a ground conductor accordingly. The configuration illustrated in FIG. 12 may also be used in some embodiments to implement a mutual capacitance capacitive sensor scheme with one side as a transmit conductor and the other as a receive conductor. In yet other embodiments, a mutual capacitance grid may be formed by dividing the surface of the cover 1201 into many sections (i.e. more than two) to form multiple transmit and receive sections such as in a grid. Alternatively, the PCB may be routed to form such a grid, similar to a mobile phone touch screen.

Figure 13:
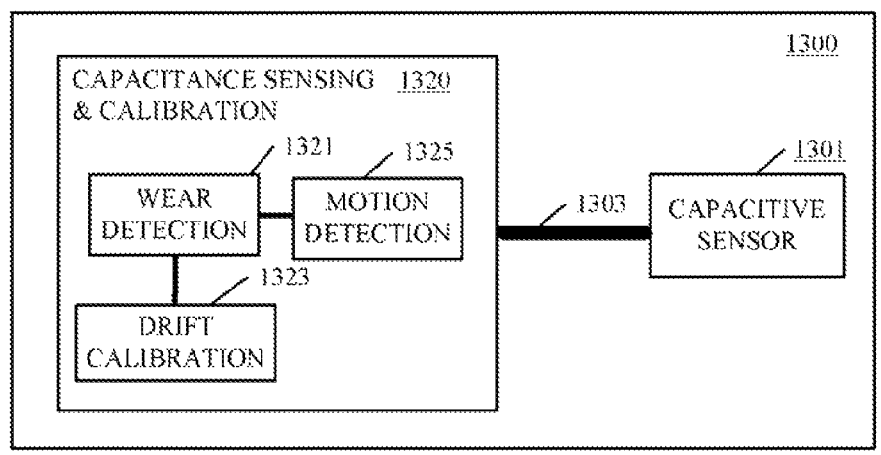
FIG. 13 is a partial schematic block diagram of a wearable device in accordance with an example embodiment.
Figure 14:
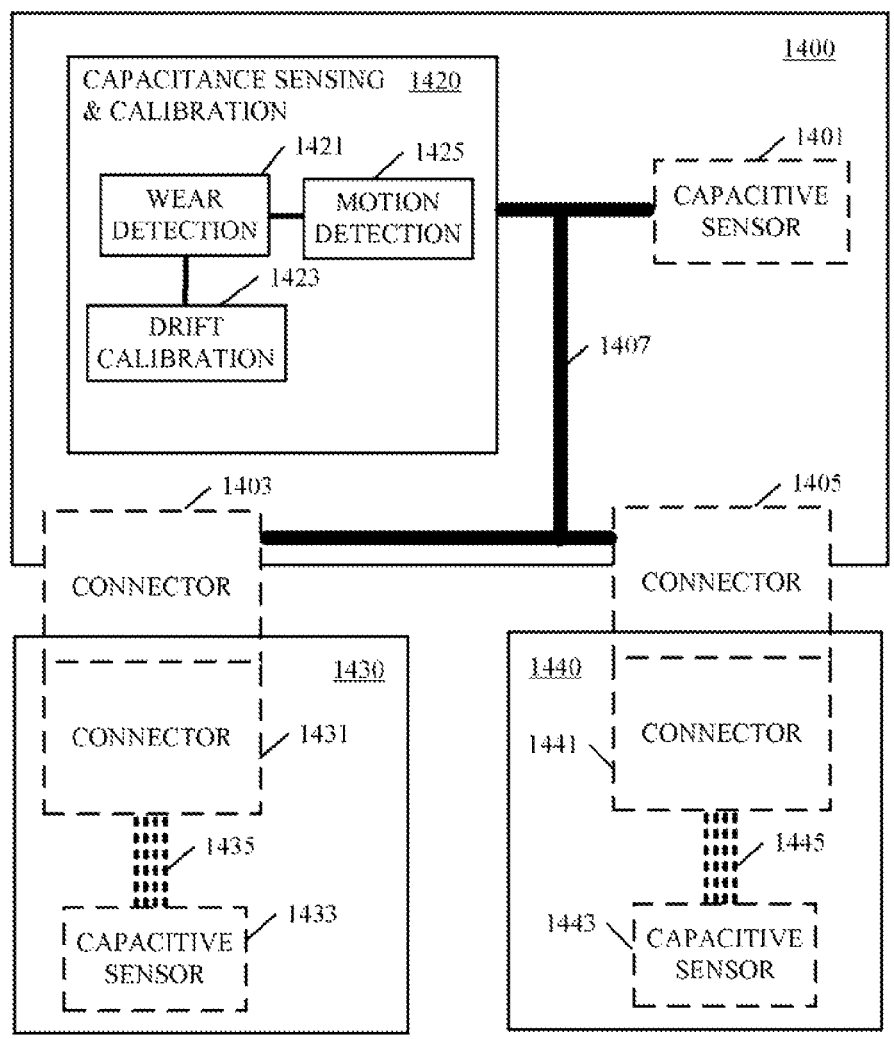
FIG. 14 is a partial schematic block diagram of a wearable mobile device in accordance with various example embodiments.
Figure 15:
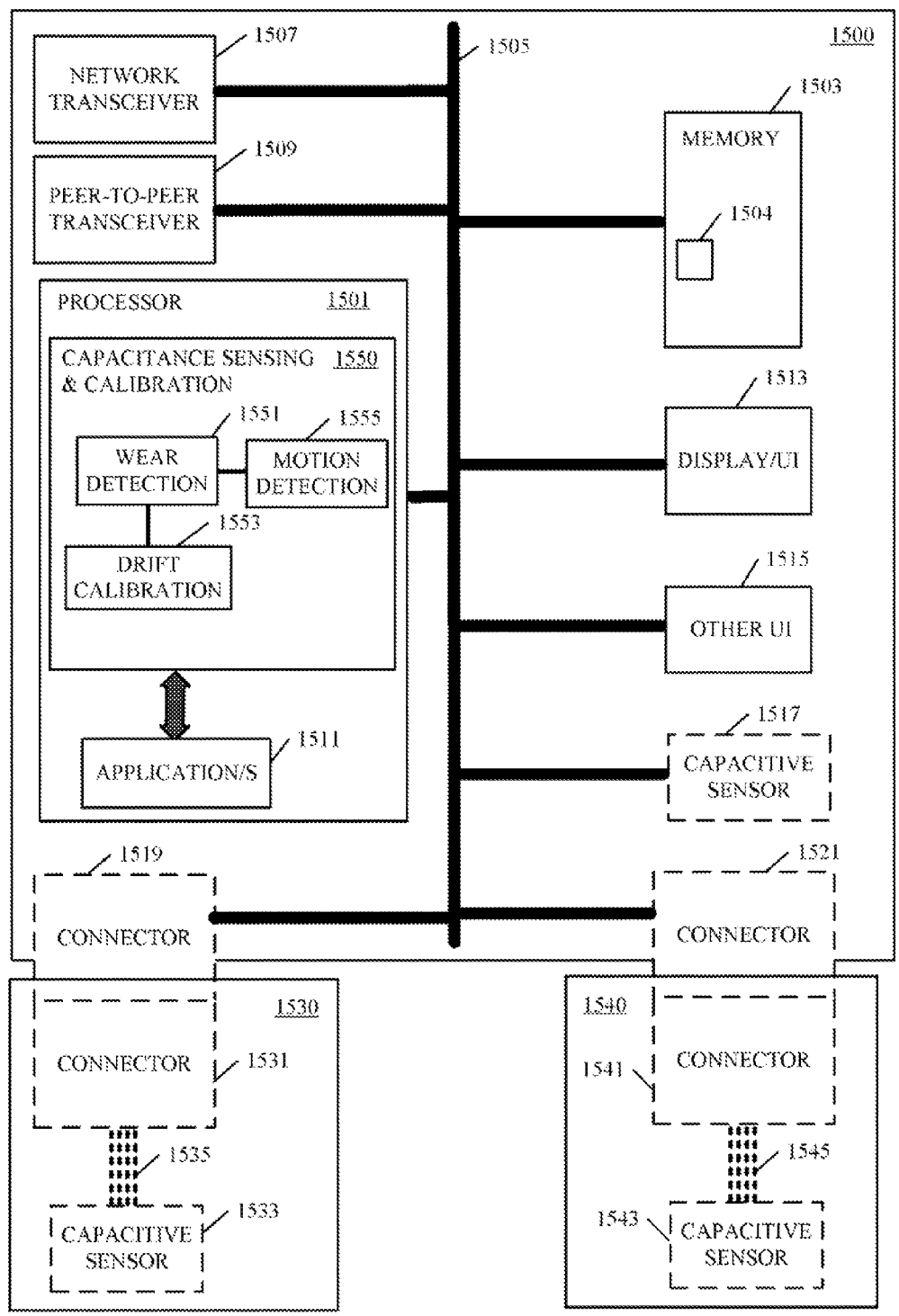
FIG. 15 is a partial schematic block diagram of a wearable mobile device in accordance with various example embodiments.
Figure 20:
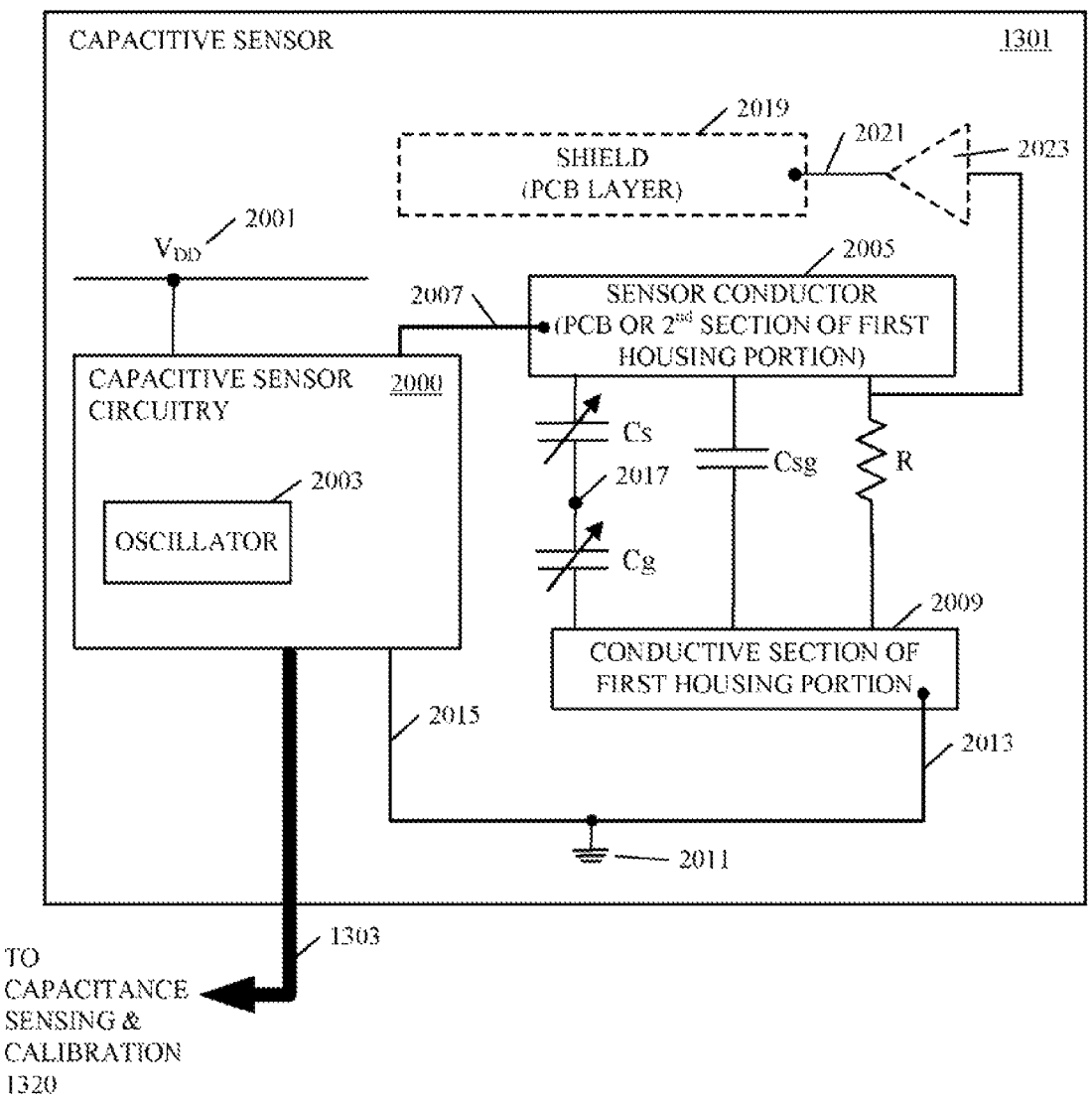
FIG. 20 is a partial schematic block diagram of a capacitive sensor as shown in FIG. 13 (or FIG. 14 or FIG. 15) and in accordance with various embodiments and shows the variable capacitances seen by the capacitive sensor when a conductive surface comes within proximity.

FIG. 13, FIG. 14 and FIG. 15 are partial schematic block diagrams of wearable devices that are examples of apparatuses in accordance with various embodiments. FIG. 13, FIG. 14 and FIG. 15 provide examples of wearable devices for the purpose of describing to those of ordinary skill how to make and use the disclosed subject matter by way of various embodiments. FIG. 20 is a partial schematic block diagram that provides further details of a capacitive sensor shown in FIG. 13 in accordance with various embodiments. It is to be understood that FIG. 13, FIG. 14, FIG. 15 and FIG. 20 are partial schematic block diagrams in that, although the diagrams show at least those components necessary to describe the features and advantages of the various embodiments to those of ordinary skill, various other components, circuitry, and devices may be necessary in order to implement a complete functional apparatus such as the example wearable devices and that those various other components, circuitry, devices, etc., are understood to be present by those of ordinary skill.

FIG. 13 illustrates a wearable device 1300 having a capacitive sensor 1301 and capacitance sensing and calibration logic 1320 operatively coupled via connection path 1303. That is, there may be one or more intermediate or intervening components between, or along the connection path 1303 such that the capacitive sensor 1301 and the capacitance sensing and calibration logic 1320 are understood to be operatively coupled. The partial schematic block diagram of FIG. 13 is applicable to any of the various embodiments having physical configurations similar to those illustrated in FIG. 2, FIG. 3, or to the cross-sectional views shown in FIG. 4, FIG. 5, FIG. 6 or FIG. 7A, 7B, 7C. The capacitive sensor 1301 drives the capacitance sensing and calibration logic 1320 along the connection path 1303 in response to a conductive surface placed within proximity of the capacitive sensor 1301. A conductive surface may be, for example, a user's finger, wrist, or some other portion of the user's skin serving as the conductive surface, an article of clothing, or a patch of conductive material that is either included within or attached to an article of clothing. In response to changes in capacitance sensed by the capacitive sensor 1301, the capacitance sensing and calibration logic 1320 may make various determinations. For example, the capacitance sensing and calibration logic 1320 may determine whether the user is wearing a wearable device 1300, whether the user wearing the wearable device 1300 is in motion, and possibly whether the user is wearing the wearable device 1300 loosely or tightly based on when the wearable device 1300 comes into proximity or makes intermittent contact with a conductive surface such as the user's wrist. The capacitance sensing and calibration logic 1320 may include components such as wear detection logic 1321, motion detection logic 1325 and drift calibration logic 1323. These components may interact and communicate with one another as needed to accomplish their respective functions. For example, the wear detection logic 1321 may provide control signaling to the drift calibration logic 1323 to defer drift calibration procedures under appropriate conditions determined by the wear detection logic 1321. Likewise the wear detection logic 1321 may communicate and receive information from the motion detection logic 1325. In some embodiments, the wear detection logic 1321 and motion detection logic 1325 may be integrated into a single component. For example, the wear detection logic 1321 may determine that the user is wearing the wearable device 1300 and the motion detection logic 1325 may determine that the user is also in motion. Under such circumstances, the wear detection logic 1321 may send a control signal to the drift calibration logic 1323 to defer drift calibration if the user is wearing the wearable device 1300 loosely. This may be accomplished in various ways such as, but not limited to, deactivating the drift calibration logic 1323, or by placing the drift calibration logic 1323 into a suspended mode or sleep mode or by imposing a wait state in which the drift calibration logic 1323 waits for further instructions before commencing further activity. The wear detection logic 1321 may also send a control signal to the drift calibration logic 1323 to start drift calibration as soon as the user is determined by the wear detection logic 1321 to be not in proximity with the sensor such as when the wearable device 1300 is loosely worn and somewhat away from the user (i.e. the conductive surface) for an extended period of time such as for a number of seconds. The motion detection logic 1325 may assess motion from the capacitance profile behavior such as by using capacitance values, timing, fluctuations, peaks and lows, limits, etc. These methods of operation are described in further detail with respect to various other drawings provided herein.

The capacitance sensing and calibration logic 1320 or any of its component logic may be implemented independently as software and/or firmware executing on one or more programmable processors (including CPUs and/or GPUs), and may also include, or may be implemented independently, using ASICs, DSPs, hardwired circuitry (logic circuitry), or combinations thereof. That is, the capacitance sensing and calibration logic 1320 may be implemented using an ASIC, DSP, executable code executing on a processor, logic circuitry, or combinations thereof. Further example details of a capacitive sensor 1301 are provide in FIG. 20 which is described below, after a discussion of various structures that may be used in the various embodiments to obtain a sensor conductor and a ground conductor in a wearable device. That is, FIG. 20 is best understood in relation to the various possible structures that may be used in the various embodiments.

The partial schematic diagram of FIG. 14 illustrates various examples of how the entire capacitive sensor, or capacitive sensor components in some embodiments, may be positioned on a wearable device 1400. That is, the partial schematic diagram of FIG. 14 illustrates possible electrical configurations that may be used in example embodiments having physical configurations such as the wristwatch 900 illustrated in FIG. 9, the wristwatch 1000 illustrated in FIG. 10, the wristwatch 1100 illustrated in FIG. 11 or the wristwatch 1200 illustrated in FIG. 12. Therefore in FIG. 14, various blocks (capacitive sensor 1401, 1433, 1443; connectors 1403, 1405, 1431, 1441, 1435, 1445) are shown having dotted lines to illustrate that various physical positions may be selected for the capacitive sensor or distributions of the capacitive sensor components. A "capacitive sensor component" refers to the sensor conductor, the sensor ground conductor, any shield, and capacitive sensor circuit components including a PCB. That is, the "capacitive sensor" blocks shown as dotted line blocks in FIG. 14 may refer to positions of some, or all, "capacitive sensor components" in embodiments where the conductive components are placed, for example, with one conductor on a wristband and another on the wearable device housing; both conductors on a single wristband; one conductor on each wristband, etc. Furthermore, in addition to the above example combinations being used to implement self-capacitance schemes, the conductor combinations may alternatively be used as transmit and receive sensor locations for mutual capacitance implementations in some embodiments. A complete "capacitive sensor" as used herein refers to the set of "capacitive sensor components" required to implement the "capacitive sensor." Examples of the "capacitive sensor components" include, but are not limited to, the sensor conductor, ground conductor, shield conductors, oscillators, comparators, clocking circuits, operational amplifiers, other active components such as transistors, and passive components such as, but not limited to, the capacitors that may be formed by the sensor conductor and ground conductors all of which are understood to be present by those of ordinary skill for implementing self-capacitance or mutual capacitance capacitive sensors. In some embodiments, some of the capacitive sensor components may be integrated into, or provided by, the capacitance sensing and calibration logic 1420.

In one example, capacitive sensor 1401 (including all capacitive sensor components) may be physically positioned on or within the housing of the wearable device 1400 as shown in the various example configurations of FIG. 2, FIG. 3, FIG. 9 through FIG. 12 and the cross-sectional views of FIG. 4 through FIG. 7. Similar to the examples described with respect to FIG. 11, the capacitive sensors 1433 and 1443 may be located on wristbands 1430 or 1440, respectively. For example, the capacitive sensor 1433 may be the capacitive sensor for the wearable device 1400 and may be coupled to connector 1431 of the wristband 1430 using a flexible connection 1435. The connector 1431, is coupled to the capacitive sensor 1433 and is also coupled to the housing of the wearable device 1400 by connector 1403. The combination of connector 1403 and connector 1431 may also be flexible such that flexing of the wristband 1430 does not damage or disconnect the operative connection between the capacitive sensor 1433 and the connection bus 1407 which is connected to connector 1403.

The wristband 1440 illustrates a similar configuration with the connection bus 1407 connected to connector 1405. The connector 1405 is attached to the wearable device 1400 housing and couples to connector 1441 and capacitive sensor 1443 which is coupled to the connector 1441 via flexible connection 1445.

Therefore in some embodiments, the example wearable device 1400 may have electrical capacitive sensor component configurations according to the physical configuration used such as the example physical configurations that have been described with respect to the wristwatch 1100 in FIG. 11. In other words, any one of the possible conductive component locations shown in FIG. 11 may be used to form a capacitive sensor scheme. Likewise, FIG. 14 illustrates example internal connections for a capacitive sensor that may be arranged corresponding to the possible locations shown for capacitive sensor 1401, 1433, or 1443, where one conductor serves as a sensor conductor and another serves as a ground conductor to complete the circuit required to implement a self-capacitance capacitive sensor, or alternatively, a mutual capacitance sensor. That is, FIG. 14 is for the purpose of showing that the capacitive sensor in accordance with various embodiments may be implemented using conductive components located either on, or embedded into, a surface of the wearable device 1400 housing or housing cover, within the wearable device 1400 housing, on one or both wristbands connected to the wearable device 1400 housing or some combination thereof so that one conductive component provides the sensing component while the other serves as a ground conductor (or alternatively, as a transmit conductor and a receive conductor). A conductive cover for the housing may also be used as a ground conductor as described above previously.

Similar to the embodiment illustrated in FIG. 13 the wearable device 1400 also includes capacitive sensing and calibration logic 1420 operatively coupled to the capacitive sensor by a connection bus 1407. The capacitance sensing and calibration logic 1420 may be a single integrated logic component or may include wear detection logic 1421, motion detection logic 1425 and drift calibration logic 1423 which may also be operatively coupled to each other to communicate with each other as was described with respect to the embodiment of FIG. 13. For embodiments where the capacitive sensor is implemented in either wristband 1430 or wristband 1440, the capacitance sensing and calibration logic 1420 is operatively coupled to the wristband capacitive sensors accordingly by one or both of the connectors 1403 or 1405 and connection bus 1407.

Partial schematic block diagram of FIG. 15 illustrates an example embodiment of a wearable device 1500 where the capacitance sensing and calibration logic 1550 is implemented as executable code 1504 executed by a processor 1501. The executable code 1504 corresponding to the capacitance sensing and calibration logic 1550 may be stored in non-volatile, non-transitory memory such as memory 1503, and read from memory 1503 as needed for execution by processor 1501. The capacitance sensing and calibration logic 1550 may include wear detection logic 1551, drift calibration logic 1553 and motion detection logic 1555. Each of these components also have corresponding executable code within the executable code 1504 and such executable code is also executed by the processor 1501 in accordance with the example embodiment of FIG. 15. The capacitance sensing and calibration logic 1550 may also communicate and interact with one or more applications 1511 which are also executed by the processor 1501, or other components of wearable device 1500. Such applications may also be stored as executable code (not shown) in memory 1503.

The wearable device 1500 is an apparatus in accordance with an embodiment and includes connection bus 1505 to provide operative coupling between various components including the at least one processor 1501, memory 1503, network transceiver 1507, peer-to-peer transceiver 1509, display/UI 1513, other UI 1515, connectors 1519 and 1521 when present, and capacitive sensor 1517 when present within the housing of wearable device 1500, etc. The connection bus 1505 provides operative coupling in that various intermediate or intervening wearable device 1500 components, circuitry, and the like, may exist in between, and/or along, the communication path between any two or more operatively coupled components, etc. The wearable device 1500 may have two wristband segments 1530 and 1540 connected to the wearable device 1500 housing. One or both of the wristband segments 1530 and 1540 may include connectors 1531 and 1541, respectively, which may be flexible connectors. One or more capacitive sensor components, or the entire capacitive sensor, may be located within one of the wristband segments. These possible locations are illustrated by blocks shown having dotted lines in FIG. 15 such as capacitive sensor 1517 and capacitive sensors 1533 and 1543 which correspond to the wristband segments 1530 and 1540, respectively. Either of the capacitive sensors 1533 or 1543 when present may also have a corresponding flexible connection 1535 or 1545, respectively. In other words, the wearable device 1500 may have a physical configuration for a capacitive sensor using various placements of the capacitive sensor components according to any one of the various examples described with respect to FIG. 11.

It is to be understood that FIG. 15 illustrates examples of components that may be present in a wearable device 1500 and that one or more of the various components shown in FIG. 15, other than the capacitive sensor and capacitance sensing and calibration logic 1550, may be omitted from the wearable device 1500 without detracting from enjoyment of the benefits, features and advantages of the present disclosure. That is, different wearable devices may or may not include some of the example components shown in FIG. 15 and therefore none of these example components are to be construed as being required for any particular embodiment.

The display/UI 1513, if present, may provide a touchscreen user interface and, in some embodiments, may also provide a graphical user interface (GUI). The network transceiver 1507, if present, may provide wireless communication capabilities for one or more wide area network communications systems such as, but not limited to, Wi-Fi cellular, 2G, 3G or 4G wireless communications systems. The peer-to-peer transceiver 1509, if present, may provide wireless connectivity capabilities such as, but not limited to, Bluetooth™, Wireless USB, ZigBee, or other technologies, etc. such as near field communication (NFC). The other UI 1515, if present, may include a track ball mouse, touch sensitive elements, physical switches, gyroscopic position sensors, etc. The display/UI 1513, if present, may include touchscreen functionality as noted above, and may be operative to receive command and control signals from the other UI 1515 directly, or via the processor 1501, for functions such as, but not limited to, mouse cursor control click to provide selection input and or drag and drop features or other functionality in some embodiments.

The memory 1503 is a non-volatile, non-transitory memory, and stores the executable code 1504 corresponding to the capacitance sensing and calibration logic 1550 including any component logic such as the wear detection logic 1551, motion detection logic 1555 or drift calibration logic 1553. The processor 1501 is operative to execute the executable code 1504, which may be stored in memory 1503, to perform the methods of operation disclosed herein.

The various embodiments also include non-volatile, non-transitory computer readable memory, other than memory 1503, that may contain executable instructions or executable code, for execution by at least one processor, that when executed, cause the at least one processor to operate in accordance with the functionality and methods of operation herein described. The computer readable memory may be any suitable non-volatile, non-transitory, memory such as, but not limited to, programmable chips such as EEPROMS, flash ROM (thumb drives), compact discs (CDs) digital video disks (DVDs), etc., that may be used to load executable instructions or program code to other processing devices such as wearable devices or other devices such as those that may benefit from the features of the herein described embodiments.

Figure 19:
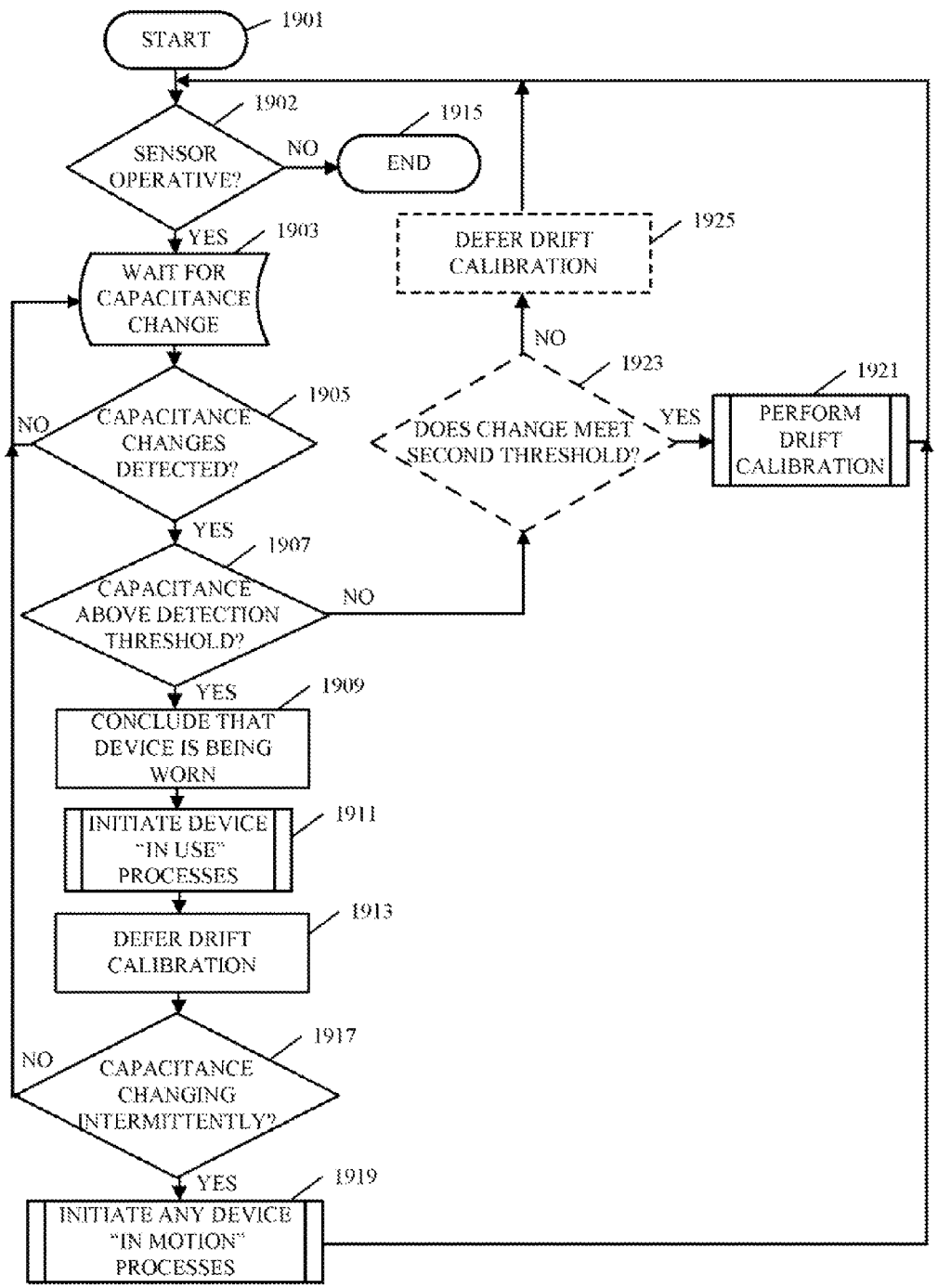
FIG. 19 is a flow chart showing a method of operation of a wearable device in accordance with some embodiments.

The operation of the capacitance sensing and calibration logic 1550 shown in FIG. 15, (also capacitance sensing and calibration logic 1320 shown in FIG. 13 and capacitance sensing and calibration logic 1420 shown in FIG. 14) is best understood in conjunction with FIG. 16, FIG. 17, FIG. 18 and FIG. 19, which will now be described. FIG. 16 is a sensed capacitance graph 1600 illustrating the usage of sensed capacitance values sensed by a capacitive sensor in accordance with various embodiments described above. FIG. 17, FIG. 18 and FIG. 19 are flow charts showing methods of operation in accordance with various embodiments.

For purposes of simplifying explanation and also for clarity, the following description will refer to the capacitance sensing and calibration logic 1550 and the capacitive sensor 1517 shown in FIG. 15. However it is to be understood that the present explanation applies equally to the capacitance sensing and calibration logic 1320 and capacitive sensor 1301 shown in FIG. 13 and to the capacitance sensing and calibration logic 1420 and the applicable capacitive sensor (selected from capacitive sensor 1401, 1433, or 1443, or some combination thereof). Referring to FIG. 16, the sensed capacitance graph 1600 illustrates that the capacitive sensor 1517 will exhibit a standalone capacitance "$C_{standalone}$" 1601 which is a baseline capacitance value determined for the capacitive sensor in the factory during production. As understood by those of ordinary skill, the baseline capacitance $C_{standalone}$ may exhibit a capacitance change 1603 over some percentage range above or below the baseline value $C_{standalone}$ due to component drift caused by temperature variations, component aging, etc. A detection threshold capacitance, "$C_{detection\ threshold}$" 1605, is used to determine when a conductive surface comes within a proximity of the capacitive sensor. The detection threshold capacitance $C_{detection\ threshold}$ 1605 may at times be affected adversely by the capacitance change 1603. However drift compensation and calibration operations adjust the baseline capacitance value such that the capacitance $C_{detection\ threshold}$ 1605 is maintained at an appropriate level above the $C_{standalone}$ 1601 to discern a change in capacitance caused by a proximal conductive surface from capacitance fluctuations due to capacitance change 1603.

Therefore, when a conductive surface comes within proximity of the capacitive sensor the capacitive sensor will sense the capacitance $C_{detection\ threshold}$ 1605, or some capacitance value above $C_{detection\ threshold}$ 1605, such that the wear detection logic 1551 of the capacitance sensing and calibration logic 1550 will make a determination that a conductive surface has been detected and is within proximity of the capacitive sensor and therefore correspondingly is in proximity of the wearable device 1500. In some embodiments such as, but not limited to, a wristwatch embodiment, the wearable device such as the wristwatch may be strapped tightly to the user's wrist. Under these circumstances, the capacitive sensor may detect a high capacitance value such as $C_{maximum}$ 1611 which would be an indication that the user has the wearable device attached tightly to the user's wrist.

Therefore as can be seen from the sensed capacitive graph 1600, conductive surface detection will occur within a conductive surface detection range 1609 which extends from a point above the baseline capacitance $C_{standalone}$ 1601, at $C_{detection\ threshold}$ 1605, to the maximum capacitance $C_{maximum}$ 1611. The detection threshold $C_{detection\ threshold}$ 1605 is used to limit the conductive surface detection range 1609 to begin above the "untouched" capacitance $C_{standalone}$ 1601 to avoid false detections due to changes in the capacitance $C_{standalone}$ 1601 which may occur due to capacitance change 1603.

Another threshold $C_{drift\ threshold}$ 1607 may also be established in some of the various embodiments. In such embodiments, capacitance values close to $C_{drift\ threshold}$ 1607, for example below $C_{drift\ threshold}$ 1607 down to the $C_{standalone}$ 1601 or to C=0, may be considered to correspond to capacitances changes 1603 due to component drift such that drift compensation may be performed accordingly. Under circumstances where the sensed capacitance is above $C_{detection\ threshold}$ 1605, it is not possible to perform drift calibration or correction due to the high sensed capacitance values within the capacitance range 1609. However, values below $C_{detection\ threshold}$ 1605 may not correspond exactly to an untouched state of the sensor. In other words, a conductive surface may still be in proximity although distant and therefore barely sensed by the capacitive sensor. In such instances, it would be useful to defer the drift compensation until it was more likely that the capacitance change is due to the capacitance change 1603 due to component drift. Therefore, the capacitance sensing and calibration logic 1552 decides accordingly when to perform drift calibration or not. The threshold $C_{drift\ threshold}$ 1607 may therefore be used in some embodiments to provide further assurance that the sensed capacitance changes are due to drift, in which case performance of drift calibration is desirable. A high-level method of operation of the capacitance sensing and calibration logic 1550 is illustrated by the flowchart of FIG. 17 which begins at block 1701.

It should be understood that the flowcharts of FIG. 17 and FIG. 18 show start and end points for purpose of explaining the operations of the described corresponding methods. However, these methods of operation may be performed continuously while the capacitive sensor is operative, that is, while the capacitive sensor is powered on which may correspond to when the corresponding wearable device is powered on. The capacitance and sensing logic is operative to perform the methods of operation, accordingly and in a continuous manner as appropriate. One method of operation begins a block 1701, and the capacitance sensing and calibration logic 1550 monitors capacitance measured by a capacitive sensor. The capacitance sensing and calibration logic 1550 determines if component drift is measurable for components of the capacitive sensor as shown in decision block 1703. That is, the capacitance sensing and calibration logic 1550 determines if the capacitance change observed by the capacitive sensor 1517 is capacitance change 1603 (i.e. due to component drift) or is due to a conductive surface being in proximity of the capacitive sensor 1517. For example, if the capacitive sensor detects a conductive surface based on sensing a capacitance value above $C_{detection\ threshold}$ 1605, the capacitance sensing and calibration logic 1550 will defer drift calibration operations as shown in block 1705. Drift calibration may be deferred in various ways such as, but not limited to, deactivating the drift calibration logic 1553, or by placing the drift calibration logic 1553 into a suspended mode or sleep mode or by imposing a wait state in which the drift calibration logic 1553 waits for further instructions, such as a wake-up or resume command, before commencing further activity. The process will then end as shown in block 1709 because the capacitance change 1603 due to component drift cannot be accurately measured. However, as long as the wearable device remains in the "untouched" state, based on the capacitance value sensed by the capacitive sensor 1517, the capacitance sensing and calibration logic 1550 will perform drift calibration for the capacitive sensor as shown by operation block 1707. Put another way, capacitance values detected or sensed by the capacitive sensor that are within the conductive surface detection range 1609, which are above the non-touch capacitance value $C_{standalone}$ 1601 and meet the $C_{detection\ threshold}$ 1605 requirement, will result in a determination, by the wear detection logic 1551 component, that the wearable device 1500 is being worn by the user. In such case, drift compensation cannot be performed properly and is therefore deferred. As noted above previously, the conductive surface detection range 1609 is dependent upon the actual $C_{detection\ threshold}$ 1605 which may change based on such drift calibration due to the capacitance change 1603. The capacitance change 1603 may occur due to temperature variations or some other factors that result in changes in parasitic capacitance. Such capacitance changes 1603 impact $C_{standalone}$ 1601 and may occur over time as understood by those of ordinary skill. The capacitance changes 1603 are taken into account by the drift calibration operation performed in block 1707. If the capacitive sensor remains untouched, such that the sensed capacitance is equal to or near $C_{standalone}$ 1601, then the capacitance change 1603 can be measured and drift compensation can be performed accordingly in process block 1707. In other words, the capacitance sensing and calibration logic 1550 determines intervals during which drift compensation may be performed, or, on the other hand, looks for intervals during which drift compensation should be deferred.

As mentioned briefly above, a second threshold $C_{drift\ threshold}$ 1607 may be set, in some embodiments, such that the capacitance sensing calibration logic 1550 makes a determination that the sensed capacitance value is within the capacitance change 1603 range and is due to component drift and not due to proximity detection of a distant conductive surface. That is, for a sensed capacitance value within the capacitance range 1603 near or below $C_{drift\ threshold}$ 1607 and below $C_{detection\ threshold}$ 1605, the wear detection logic 1551 of the capacitance sensing and calibration logic 1550 may send an activation signal to the drift calibration logic 1553. In some instances when a wristwatch wearable device or other wearable device is worn so loosely that it intermittently comes in contact with the user's wrist or body such that the sensed capacitance remains below $C_{drift\ threshold}$ 1607, the capacitance may be considered as being approximately equivalent to the non-touch capacitance value $C_{standalone}$ 1601 such that it is possible to determine the capacitance change 1603 and make drift calibration adjustments to the baseline capacitance. Therefore, in such embodiments, any capacitance value within the capacitance range 1609 would result in deferring the drift calibration operations of drift calibration logic 1553.

Another scenario that may occur for wearable devices is that the conductive surface intermittently comes within contact or within proximity of, the capacitive sensor such that the sensed capacitance oscillates and is possibly sinusoidal such that the capacitance change 1603 is also not able to be correctly determined. The flowchart of FIG. 18 provides further details of operation and illustrates methods of operation that account for both intermittent detection and for capacitance values within the capacitance range 1609 corresponding to a loosely worn device. The method of operation begins in block 1801 and a conductive surface may be detected as shown in decision block 1803. If such detection occurs in decision block 1803, then the calibration sensing the capacitance sensing calibration logic 1550 determines whether the capacitance value sensed is intermittent as shown in decision block 1805. If the capacitance values are intermittent, then drift calibration is deferred as shown in block 1807. If no conductive surface is detected in decision block 1803, then drift calibration may be performed by the drift calibration logic 1553 as illustrated by the drift calibration operation block 1811. The method of operation may then end as shown in block 1809.

If the capacitance sensed by the capacitive sensor is not intermittent in decision block 1805, then the capacitance sensing calibration logic 1550 will determine whether the sensed capacitance is within $C_{drift\ threshold}$ 1607 as shown in decision block 1813. If not, and for example the capacitance sensed is within the capacitance range 1609, the drift calibration operation will be deferred as shown in block 1807 and the process will end in block 1809. However if the capacitance sensed is within the threshold, for example if the capacitance sensed is below $C_{drift\ threshold}$ 1607, drift calibration will be performed by the drift calibration logic 1553 as shown in block 1815 and the process will end in block 1809. The drift calibration operation of block 1811 may be modified from the drift calibration operation of block 1815, if surface detection based on $C_{detection\ threshold}$ 1605 is used to trigger or defer drift compensation. That is, if the verification threshold $C_{drift\ threshold}$ 1607 is used in conjunction with $C_{detection\ threshold}$ 1605, sensed capacitances may occur below $C_{detection\ threshold}$ 1605 that are not close enough to the non-touch capacitance $C_{standalone}$ 1601 to allow correct performance of drift compensation. That is, the drift calibration logic 1553 may account for some values of sensed capacitance below $C_{detection\ threshold}$ 1605 and may accordingly apply different adjustment values based on percentage changes that are known or expected to be within a capacitance range between 1605 and 1607. Otherwise, drift compensation is deferred until the sensed capacitance value is near or below $C_{drift\ threshold}$ 1607, which is used to add further assurance that the sensed capacitance value is within the capacitance change 1603 range and is due to component drift only (i.e. not due to a distant proximal conductive surface).

The flowchart of FIG. 19 describes methods of operation that provide additional features and advantages when employing the capacitance sensing calibration logic 1550 in conjunction with a capacitive sensor. The method of operation begins in block 1901 and may run continuously provided that the capacitive sensor is operative as shown in decision block 1902. For example, once the wearable device 1500 is powered up the capacitive sensor may begin to be operative in that it begins to sense capacitance changes as shown in decision block 1902. Whenever the wearable device 1500 is powered down the capacitive sensor may no longer be operative in decision block 1902 and the method of operation of will terminate as shown in block 1915. Under some circumstances, and in some embodiments, the capacitive sensor may remain operative when the wearable device 1500 enters a sleep mode and when various other processes and operations are shut down in order to conserve battery power. Once the capacitive sensor is operative as shown in decision block 1902, the capacitive sensor monitors capacitance and the capacitance sensing and calibration logic 1550 waits for changes in capacitance as shown in input block 1903. When any capacitance change is sensed by the capacitive sensor in decision block 1905, the determination of whether the sensed capacitance is above the detection threshold is made in decision block 1907. For example, if the capacitive sensor detects a capacitance above $C_{detection\ threshold}$ 1605, wear detection logic 1551 of the capacitance sensing calibration logic 1550, may conclude that the wearable device 1500 is being worn as shown in block 1909. In response to this conclusion, the calibration sensing the capacitance sensing calibration logic 1550 may interact with various components of the wearable device 1500 including software such as applications 1511. Some of the components of wearable device 1500, including applications 1511, may benefit from an indication that the wearable device 1500 is being worn by the user or is otherwise in use. For various reasons such as, but not limited to, conservation of battery charge, some processes or applications 1511 may be deferred from operation until the wear detection logic 1551 determines that the wearable device 1500 is in use. Such "in use" processes or applications may be initiated in process block 1911 accordingly as shown and drift calibration will be deferred in block 1913. In addition, the capacitance sensing calibration logic 1550 will determine whether the sensed capacitance is changing intermittently as shown in decision block 1917. If yes, intermittent capacitance detection in decision block 1917 may initiate motion detection logic 1555 which may receive information from the wear detection logic 1551 component, or may receive input directly from the capacitive sensor, i.e. by way of the connection bus 1505. The motion detection logic 1555 may provide outputs to various components of wearable device 1500 or to one or more applications 1511. The motion detection logic 1555 may also send command and control signals to place various components of the wearable device 1500 into a low power or sleep mode in order to conserve battery power. For example, based on the detection of motion and for given "levels" or motion detected by the motion detection logic 1555, the display/UI 1513 may be turned off until the motion stops so as to conserve power, since it is unlikely the display will be useful if the detected motion indicates that the user may be in continuous motion such as when running.

Some processes or applications may be desirable to operate when the wearable device 1500 is determined to be in motion. Therefore, based on the capacitance changing intermittently in decision block 1917 any processes or applications 1511 which are "in motion" processes may be initiated as shown in process block 1919. For example, the motion detection logic 1555 may provide outputs to drive a pedometer application, a sleep monitor application of some other application or process, etc., that require the user to be in motion in order to properly function or to receive information. Provided the capacitive sensor is still operative as shown in decision block 1902, the capacitive sensing and calibration logic 1550 will continue to wait for capacitance changes as shown in input block 1903 and the method of operation will continue.

If the sensed capacitance was above the detection threshold in decision block 1907, and is not changing intermittently in decision block 1917, drift calibration operations would still be deferred as shown in block 1913 and capacitance sensing and calibration logic 1550 would continue to wait for input in block 1903. However, as was discussed above with respect to sensed capacitance graph 1600, a second threshold, $C_{drift\ threshold}$ 1607, may be established by the capacitance sensing and calibration logic 1550. In this example, decision block 1923 and block 1925 which, as indicated by dotted lines in FIG. 19, are not used in all embodiments, may be implemented. In this example scenario, if the sensed capacitance is within the second threshold $C_{drift\ threshold}$ 1607, such as below it, in decision block 1923, then drift calibration will be performed in block 1921. However, if the $C_{drift\ threshold}$ 1607 is not met, then drift calibration will still be deferred in block 1925 due to uncertainty as to whether the capacitance sensed is due to drift or due to a distant proximal conductive surface being detected below the $C_{detection\ threshold}$ 1605. In embodiments where the $C_{drift\ threshold}$ 1607 is not used, drift calibration is performed in block 1921 for any sensed capacitance below $C_{detection\ threshold}$ 1605 in decision block 1907.

Returning to decision block 1905, in some embodiments if the sensed capacitance is not above the detection threshold in block 1907, the capacitance calibration and sensing logic 1550 looks for changes in capacitance in decision block 1923 that meet the $C_{drift}$ threshold 1607 and then the drift calibration logic 1553 will perform drift calibration in block 1921 and the process may continue. Otherwise, drift calibration is deferred in block 1925 and the process continues as shown and capacitance continues to be monitored.

Turning to FIG. 20, a partial schematic block diagram of a capacitive sensor 1301 as shown in FIG. 13 (or 1401, 1433, 1443 in FIG. 14 or 1517, 1533, 1543 in FIG. 15) and in accordance with various embodiments will now be described. As discussed above with respect to FIG. 2, FIG. 3 and FIGS. 7A, 7B and 7C, a wearable device in accordance with some embodiments has a housing which is an enclosure that has a first portion and a second portion, where one of the first portion or the second portion may be considered to be a cover of the housing or enclosure. Thus, a sensor conductor 2005 may be located on a PCB surface as shown in FIG. 7A, 7B or 7C, or may be a section of a housing portion, such as a cover, as shown in FIG. 4. The first housing portion has at least one conductive section 2009 that is connected to circuit ground 2011 by a connection 2013.

A power source provides a voltage $V_{DD}$ 2001 to power capacitive sensor circuitry 2000. The power source may be a rechargeable battery, a disposable battery, a solar battery, a battery that is recharged by electrostatic or gyroscopic energy or wireless recharging, etc. The capacitive sensor circuitry 2000 includes at least one oscillator 2003 and may include other "capacitive sensor components" such as, but not limited to, comparators, clocking circuits, operational amplifiers, other active components such as transistors, and passive components, etc. The capacitive sensor circuitry 2000 is operatively coupled to the capacitance sensing and calibration logic 1320 by connection path 1303, and is connected to circuit ground 2011 by connection 2015. The capacitive sensor circuitry 2000 is connected to the sensor conductor 2005 by connection 2007 and drives the voltage to provide a charge on the sensor conductor 2005. That is, the sensor conductor 2005 forms one "plate" of a capacitor and the grounded conductive section 2009 of the housing portion forms the other capacitor "plate."

As a conductive surface comes within proximity of the sensor conductor 2005 and grounded conductive section 2009, the electric field is disrupted and the variable capacitances Cs and Cg change to impact the overall capacitance value viewed by the capacitive sensor circuitry 2000. The node 2017 represents the point where the conductive surface (such as the user's wrist, etc.) comes into proximity or contact and forms the capacitances Cs and Cg. Cs represents the capacitance formed between the conductive surface and the sensor conductor 2005. An example is when the user's wrist, which in this case is the conductive surface, comes within proximity of the sensor conductor 2005. The user's body also creates a variable capacitance Cg between the user's body and ground by being in proximity to the grounded conductive section 2009 as illustrated by node 2017. The capacitance Csg represents the capacitance that exists between the sensor conductor 2005 and the grounded conductive section 2009 including any parasitic capacitance that may exist as was described above with respect to the various structures that may be utilized. The capacitive sensor circuitry 2000 sees a total capacitance Ceq which is determined by the parallel combination of Cs and Cg in series, with Csg. That is, the capacitance computation for the total capacitance seen by the capacitive sensor circuitry 2000=Ceq=[(Cs and Cg in series)+Cg]=[(CsCg)/(Cs+Cg)]+Cg. An equivalent resistance value R is also seen between the "plates," and in some embodiments, a driven shield 2019 may be operatively coupled 2021 by the operational amplifier 2023, both of which are shown in dotted lines to illustrate that they may, or may not, be present in any particular embodiment. The driven shield 2019 is a PCB layer as discussed, for example, with respect to FIG. 6, FIG. 7C and FIG. 8. The driven shield 2019 protects any other circuitry, components, etc. from undesired coupling or interference due to the sensor conductor 2005 and/or the conductive section 2009.

The capacitive sensor circuitry 2000 may be implemented in various ways in the various embodiments such as by discrete components, integrated circuits, etc. as was discussed above with respect to the capacitance sensing and calibration logic 1320. The capacitive sensor circuitry 2000 may be implemented on one or more layers of the PCB having the sensor conductor 2005 or on a different PCB positioned within the housing. The capacitive sensor circuitry 2000 may be integrated, in whole or in part, with the capacitance sensing and calibration logic 1320 as was discussed previously above.

While various embodiments have been illustrated and described, it is to be understood that the invention is not so limited. Numerous modifications, changes, variations, substitutions and equivalents will occur to those skilled in the art without departing from the scope of the present invention as defined by the appended claims.

What is claimed is:

1. A wearable device, comprising:
   a first housing portion having a conductive section and a non-conductive section, the conductive section being connected to ground;
   a second housing portion including a printed circuit board with a conductor on the printed circuit board surface positioned beneath the non-conductive section of the first housing portion, the conductor on the printed circuit board surface and the conductive section of the first housing portion forming a capacitor of a capacitive sensor; and
   capacitive sensor circuitry, operatively coupled to the conductor on the printed circuit board surface, wherein the capacitive sensor circuitry drives a voltage of the conductor on the printed circuit board surface to create a capacitive charge between the conductor on the printed circuit board surface and the conductive section of the first housing portion.

2. The wearable device of claim 1, further comprising:
a first adhesive layer between a surface of the non-conductive section of the first housing portion and the printed circuit board surface.

3. The wearable device of claim 2, further comprising:
a second adhesive layer, coplanar with the first adhesive layer, between a surface of the conductive section of the first housing portion and the printed circuit board surface.

4. The wearable device of claim 3, wherein the first adhesive layer and the second adhesive layer form a water tight seal that prevents liquids from penetrating into at least the second housing portion.

5. The wearable device of claim 4, further comprising:
a tolerance gap between adjacent edges of the first adhesive layer and the coplanar second adhesive layer, the tolerance gap allowing coplanar expansion of the first adhesive layer or the second adhesive layer due to temperature or pressure.

6. The wearable device of claim 1, further comprising:
a conductive shield, formed as a layer of the printed circuit board.

7. The wearable device of claim 1, wherein the capacitive sensor circuitry further drives a shield layer of the printed circuit board to the same voltage as the conductor on the printed circuit board surface.

8. The wearable device of claim 1, wherein the first housing portion conductive section comprises a cutout or bore and wherein the non-conductive section is fitted within the cutout or bore of the conductive section.

9. The wearable device of claim 8, wherein the non-conductive section has an interference fit with the cutout or bore of the first housing portion conductive section.

10. The wearable device of claim 8, further comprising:
a non-conductive insulator between an outer perimeter of the non-conductive section and the conductive section.

11. The wearable device of claim 10, wherein the non-conductive insulator is a grommet comprising a t-shaped cross-section.

12. The wearable device of claim 10, wherein the grommet further comprises:
an axially extending cylindrical portion; and
a radial disc portion connected to the axially extending cylindrical portion.

13. A wearable device, comprising:
a first housing portion having first and second conductive sections separated by a non-conductive insulator, with the first conductive section being connected to ground;
a second housing portion including a printed circuit board, the second conductive section operatively coupled to the printed circuit board, the first and second conductive sections forming a capacitor of a capacitive sensor; and
capacitive sensor circuitry, operatively coupled to the printed circuit board surface, wherein the capacitive sensor circuitry drives a voltage of the second conductive section to create a capacitive charge between the second conductive section and the first conductive section of the first housing portion.

14. The wearable device of claim 13, wherein the first housing portion comprises a cutout or bore within the first conductive section and the second conductive section is fitted within the cutout or bore of the first conductive section; and
wherein the non-conductive insulator surrounds an outer perimeter of the second conductive section.

15. A wearable device comprising:
a first non-conductive housing portion;
a second housing portion including a printed circuit board with a conductor on the printed circuit board surface positioned beneath the non-conductive housing portion;
a ground conductor, the conductor on the printed circuit board surface and the ground conductor forming a capacitor of a capacitive sensor; and
capacitive sensor circuitry, operatively coupled to the conductor on the printed circuit board surface, wherein the capacitive sensor circuitry drives a voltage of the conductor on the printed circuit board surface to create a capacitive charge between the conductor on the printed circuit board surface and the ground conductor.

16. The wearable device of claim 15, wherein the ground conductor is positioned on an outer surface of the first non-conductive housing portion.

17. The wearable device of claim 15, further comprising:
a wristband segment connected to the second housing portion, where the ground conductor is positioned on the wristband segment.

18. A wearable device, comprising:
a first wristband segment;
a second wristband segment, wherein the first wristband segment and the second wristband segment are connected to a housing of the wearable device;
a first conductor positioned on the first wristband segment;
a second conductor positioned on the second wristband segment, the first conductor and the second conductor forming a capacitor of a capacitive sensor; and
capacitive sensor circuitry, operatively coupled to the first conductor, wherein the capacitive sensor circuitry drives a voltage of the first conductor to create a capacitive charge between the first conductor and the second conductor.

19. A wearable device, comprising:
a housing having a wristband connected to the housing;
a first conductor positioned on the wristband and a second conductor positioned on the housing, the first conductor and the second conductor forming a capacitor of a capacitive sensor; and
capacitive sensor circuitry, operatively coupled to the second conductor on the housing, wherein the capacitive sensor circuitry drives a voltage of the second conductor on the housing to create a capacitive charge between the second conductor on the housing surface and the first conductor on the wristband.

* * * * *